US012776783B2

(12) United States Patent
Jeon et al.

(10) Patent No.: US 12,776,783 B2
(45) Date of Patent: Oct. 27, 2026

(54) PIPELINED ANALOG-TO-DIGITAL CONVERTER AND METHOD OF ANALOG-TO-DIGITAL CONVERSION

(71) Applicant: Samsung Electronics Co., Ltd., Suwon-si (KR)

(72) Inventors: Minki Jeon, Suwon-si (KR); Seungyeob Baek, Suwon-si (KR); Jaewoo Park, Suwon-si (KR); Myoungbo Kwak, Suwon-si (KR); Junghwan Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 141 days.

(21) Appl. No.: 18/791,908

(22) Filed: Aug. 1, 2024

(65) Prior Publication Data

US 2025/0219651 A1 Jul. 3, 2025

(30) Foreign Application Priority Data

Dec. 29, 2023 (KR) ........................ 10-2023-0196038

(51) Int. Cl.
*H03M 1/12* (2006.01)
*H03M 1/18* (2006.01)
*H03M 1/46* (2006.01)

(52) U.S. Cl.
CPC ........... *H03M 1/122* (2013.01); *H03M 1/181* (2013.01); *H03M 1/462* (2013.01)

(58) Field of Classification Search
CPC ......... H03M 1/22; H03M 1/181; H03M 1/462
USPC ........................................ 341/155, 144, 161
See application file for complete search history.

(56) References Cited

U.S. PATENT DOCUMENTS 6,124,818 A * 9/2000 Thomas ................ H03M 1/164 341/161
9,900,023 B1 2/2018 Kinyua
10,541,698 B1 1/2020 Moore
10,868,557 B2 12/2020 Kinyua et al.
11,177,821 B1 11/2021 Steensgaard-Madsen et al.
11,223,367 B2 1/2022 Jang et al.
2010/0039303 A1* 2/2010 Tsukamoto ......... H03M 1/1061 341/172
2011/0001560 A1* 1/2011 Eschauzier ......... H03M 1/0692 330/253

(Continued)

FOREIGN PATENT DOCUMENTS

KR 10-1686217 12/2016
KR 10-2021-0100438 8/2021
KR 10-2380966 4/2022

*Primary Examiner* — Peguy Jean Pierre
(74) *Attorney, Agent, or Firm* — Fish & Richardson P.C.

(57) ABSTRACT

A pipelined analog-to-digital converter includes a first stage circuit and a second stage circuit. The first stage circuit performs an analog-to-digital conversion on an analog input voltage to generate a first output signal including M higher bits among (M+N) bits of a digital output code corresponding to the analog input voltage, and generates a residue voltage corresponding to N lower bits among the (M+N) bits of the digital output code wherein M and N are natural numbers. The second stage circuit includes a residue amplifier configured to sequentially amplifying the residue voltage and a comparison voltage to generate an amplified residue voltage and an amplified comparison voltage.

19 Claims, 28 Drawing Sheets

(56) References Cited

U.S. PATENT DOCUMENTS

| | | | | |
|---|---|---|---|---|
| 2011/0012764 | A1* | 1/2011 | Venkataraman .... | H03M 1/0695 341/172 |
| 2022/0337258 | A1 | 10/2022 | Shen et al. | |

* cited by examiner

10

PIPELINED ANALOG-TO-DIGITAL CONVERTER AND METHOD OF ANALOG-TO-DIGITAL CONVERSION

CROSS-REFERENCE TO RELATED APPLICATION

This U.S. non-provisional application claims priority under 35 USC § 119 to Korean Patent Application No. 10-2023-0196038, filed in the Korean Intellectual Property Office on Dec. 29, 2023, the disclosure of which is incorporated by reference herein in its entirety.

BACKGROUND

An analog-to-digital converter may convert an analog input signal into a digital output signal. For example, a wireless communication system may use an analog-to-digital converter to convert a received radio frequency (RF) signal into a baseband signal and generate a digital output signal based on an analog baseband signal. Examples of the analog-to-digital converter may include a flash-type analog-to-digital converter, a successive approximation register (SAR) type analog-to-digital converter, a sigma delta analog-to-digital converter, and the like, and each type may be used in a field according to the characteristics thereof. The flash-type analog-to-digital converter has faster operation speed, but includes 2n comparators to provide n-bit digital output signals. Thus, the flash-type analog-to-digital converter consumes a large amount of power and has a large implementation area. The sigma delta analog-to-digital converter has a high signal-to-noise ratio (SNR), but a feedback gain of a delta modulator including passive elements is fixed to 1. Compared with the flash-type analog-to-digital converter, the SAR-type analog-to-digital converter has low operation speed, but includes only one comparator. Thus, the SAR-type analog-to-digital converter may reduce power consumption and occupation area. Various electronic devices include many analog-to-digital converters and the power consumption and occupation area may be increased as the number of the analog-to-digital converters increase.

SUMMARY

In general, in some aspects, the present disclosure is directed toward a pipelined analog-to-digital converter and a method of analog-to-digital conversion using the pipelined analog-to-digital converter, capable of efficiently performing a low-power conversion.

According to some implementations, the present disclosure is directed to a pipelined analog-to-digital converter that includes a first stage circuit and a second stage circuit. The first stage circuit performs an analog-to-digital conversion on an analog input voltage to generate a first output signal including M higher bits among (M+N) bits of a digital output code corresponding to the analog input voltage, and generates a residue voltage corresponding to N lower bits among the (M+N) bits of the digital output code wherein M and N are natural numbers. The second stage circuit includes a residue amplifier configured to sequentially amplifying the residue voltage and a comparison voltage to generate an amplified residue voltage and an amplified comparison voltage. The second stage circuit performs an analog-to-digital conversion on the amplified residue voltage based on the amplified comparison voltage to generate a second output signal including the N lower bits corresponding to the residue voltage.

According to some implementations, the present disclosure is directed to a pipelined analog-to-digital converter that includes a first analog-to-digital converter configured to perform an analog-to-digital conversion on an analog input signal to generate a first output signal including M higher bits among (M+N) bits of a digital output code corresponding to the analog input voltage wherein M and N are natural numbers, a first digital-to-analog converter configured to perform a digital-to-analog conversion on the M higher bits to generate a coarse comparison voltage corresponding to the M higher bits. aa voltage subtractor configured to generate a residue voltage corresponding to N lower bits among the (M+N) bits of the digital output code by subtracting the coarse comparison voltage from the analog input voltage, a residue amplifier configured to sequentially amplifying the residue voltage and a comparison voltage to generate an amplified residue voltage and an amplified comparison voltage, a first input switch configured to be turned on in response to a sampling signal activated in a sampling period to apply the residue voltage to an input terminal of the residue amplifier, a second input switch configured to be turned on in response to a conversion signal activated in a conversion period following the sampling period to apply the comparison voltage to the input terminal of the residue amplifier, a comparison circuit configured to compare the amplified residue voltage and the amplified comparison voltage to generate a comparison result signal, a SAR logic circuit configured to generate a plurality of control signals for a binary search conversion based on the comparison result signal and generate a second output signal including the N lower bits corresponding to the residue voltage, and a second digital-to-analog converter configured to generate the comparison voltage based on the plurality of control signals.

According to some implementations, the present disclosure is directed to a method of analog-to-digital conversion that includes performing an analog-to-digital conversion on an analog input voltage to generate a first output signal including M higher bits among (M+N) bits of a digital output code corresponding to the analog input voltage wherein M and N are natural numbers, generating a residue voltage corresponding to N lower bits among the (M+N) bits of the digital output code, using a single residue amplifier, sequentially amplifying the residue voltage and a comparison voltage to generate an amplified residue voltage and an amplified comparison voltage, and performing an analog-to-digital conversion on the amplified residue voltage based on the amplified comparison voltage to generate a second output signal including the N lower bits corresponding to the residue voltage.

According to some implementations, the present disclosure is directed to a pipelined analog-to-digital converter and a method of analog-to-digital conversion that may reduce power consumption for analog-to-digital conversion and enhance accuracy of the analog-to-digital conversion, by sequentially amplifying the residue voltage and the comparison voltage using the one residue amplifier.

BRIEF DESCRIPTION OF THE DRAWINGS

Example implementations will be more clearly understood from the following detailed description, taken in conjunction with the accompanying drawings.

DETAILED DESCRIPTION

Figure 1:
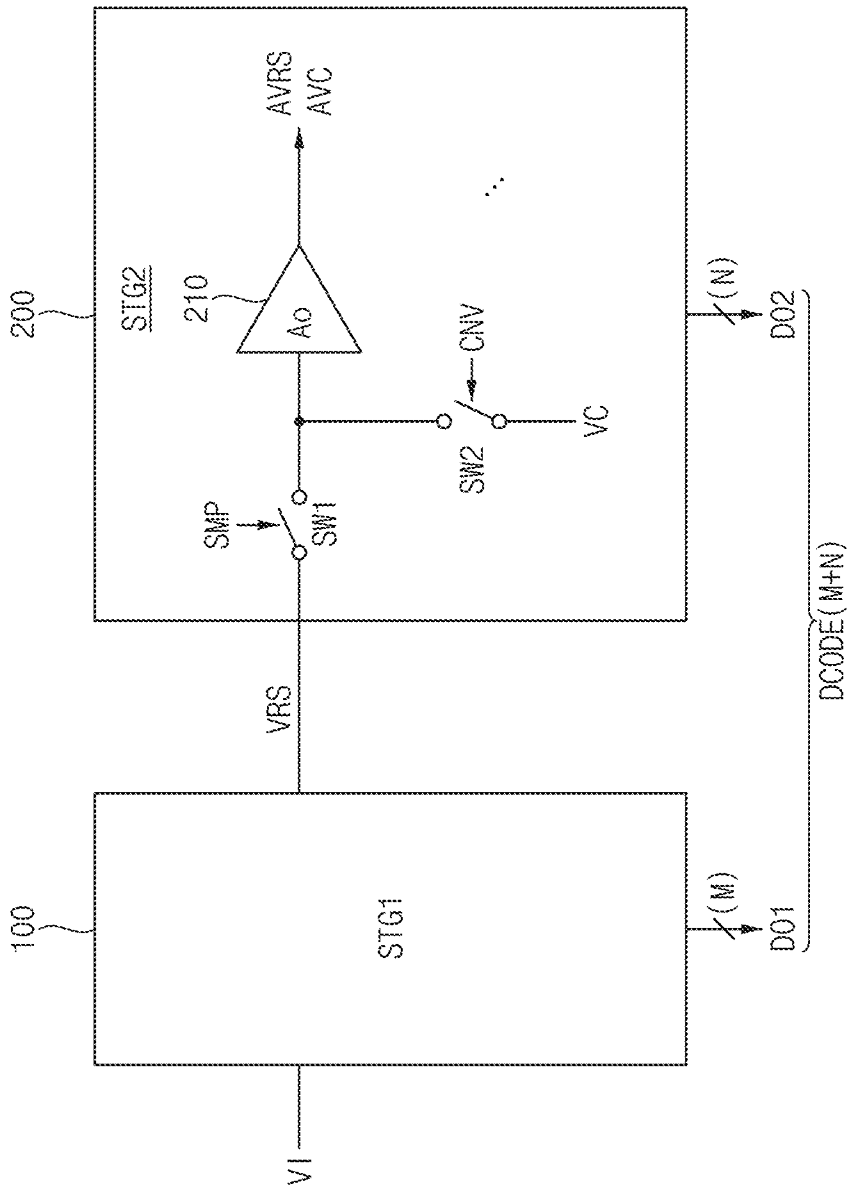
FIG. 1 is a block diagram illustrating an example of a pipelined analog-to-digital converter according to some implementations.

Hereinafter, example implementations will be explained in detail with reference to the accompanying drawings. In the drawings, like numerals refer to like elements throughout. The repeated descriptions may be omitted.

Figure 2:
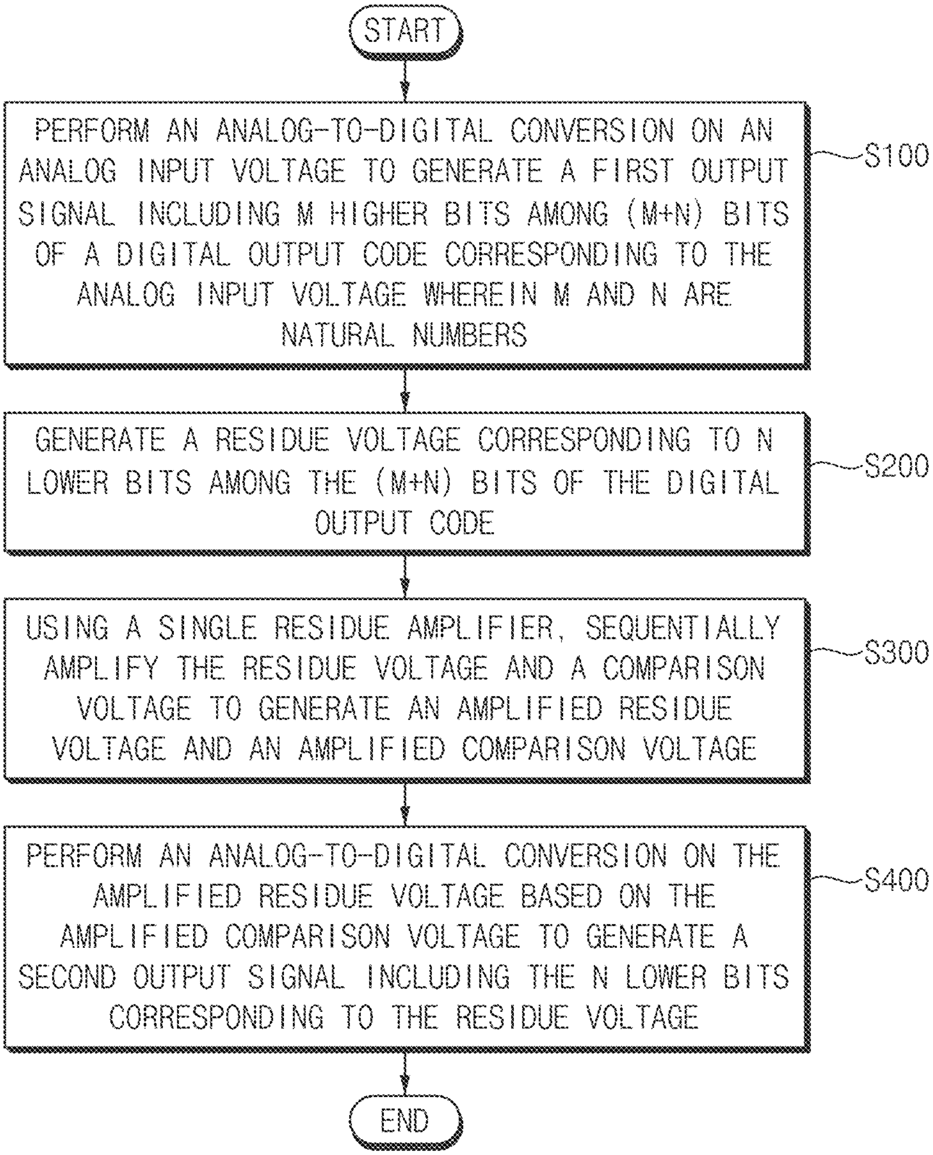
FIG. 2 is a flowchart illustrating an example of a method of analog-to-digital conversion according to some implementations.

FIG. 1 is a block diagram illustrating an example of a pipelined analog-to-digital converter according to some implementations, and FIG. 2 is a flowchart illustrating an example of a method of analog-to-digital conversion according to some implementations. In FIG. 1, a pipelined analog-to-digital converter 10 may include a first stage circuit (STG1) 100 and a second stage circuit (STG2) 200. The pipelined analog-to-digital converter 10 may perform an analog-to-digital conversion on the analog input voltage VI to generate a digital output code DCODE corresponding to the analog input voltage VI. Hereinafter, some implementations will be described mainly based on a two-stage analog-to-digital conversion to generate a digital output code DCODE including (M+N) bits. The present disclosure is not limited to the two-stage analog-to-digital conversion and may be applied to analog-to-digital conversion of three or more stages, as will be described below with reference to FIG. 27.

In FIGS. 1 and 2, a first stage circuit 100 may perform an analog-to-digital conversion on an analog input voltage VI to generate a first output signal DO1 including M higher bits among (M+N) bits of a digital output code DCODE corresponding to the analog input voltage VI, wherein M and N are each natural numbers (S100). The first stage circuit 100 may perform various analog-to-digital conversions, such as a flash type, a sigma-delta type, a successive approximation register (SAR) type, and the like. Further, the first stage circuit 100 may generate a residue voltage VRS corresponding to N lower bits among the (M+N) bits of the digital output code DCODE (S200).

The second stage circuit 200 may sequentially amplify the residue voltage VRS and a comparison voltage VC to sequentially generate an amplified residue voltage AVRS and an amplified comparison voltage AVC using one residue amplifier 210 (S300). For the sequential amplification, the second stage circuit 200 may include a first input switch SW1 that is turned on in response to a sampling signal SMP and a second input switch SW2 that is turned on in response to a conversion signal CNV.

The second stage circuit 200 may perform an analog-to-digital conversion on the amplified residue voltage AVRS based on the amplified comparison voltage AVC to generate a second output signal DO2 including the N lower bits corresponding to the residue voltage VRS (S400). In some implementations, the second stage circuit 200 may perform a SAR-type analog-to-digital conversion, such that the second stage circuit 200 performs a binary search conversion to sequentially determine the N lower bits from the most significant bit to the least significant bit with varying the voltage level of the comparison voltage VC.

Figure 3:
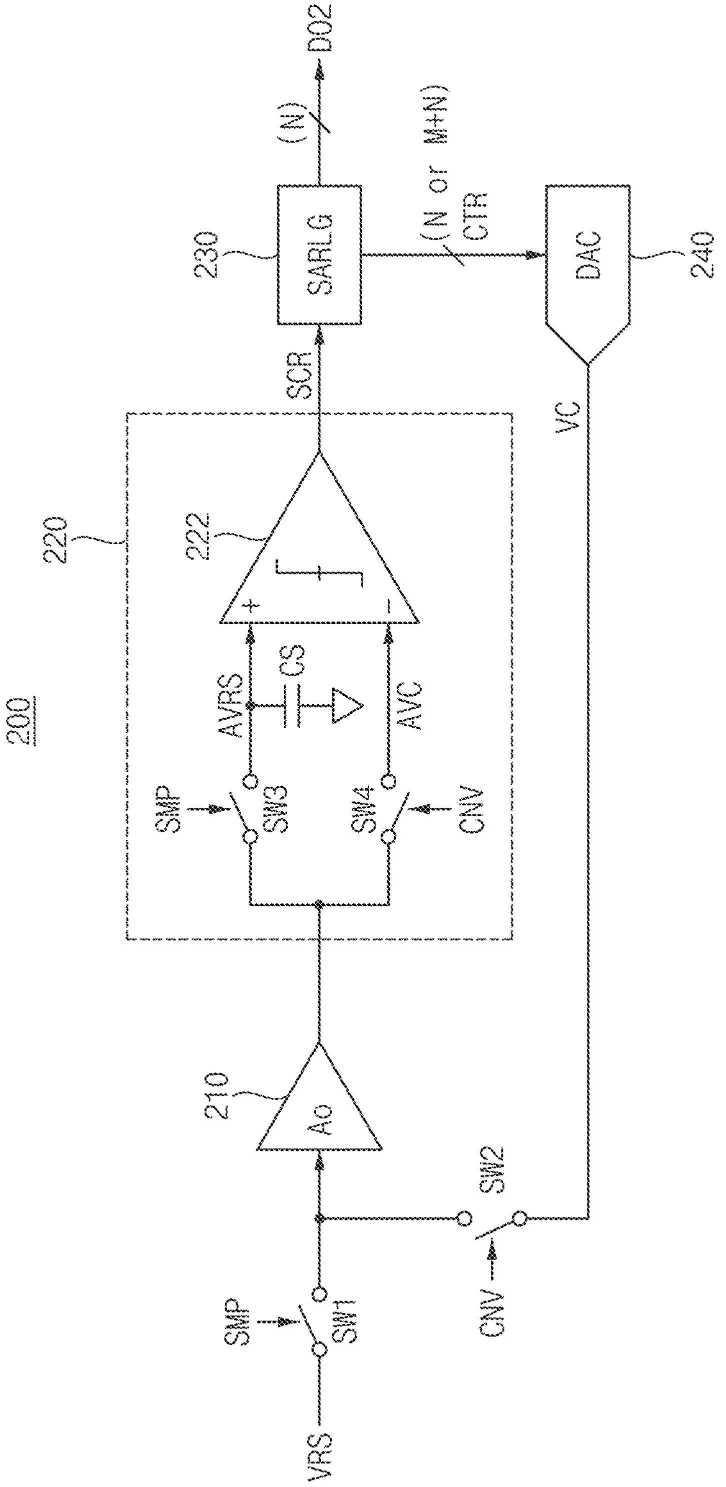
FIG. 3 is a diagram illustrating an example of a second stage circuit included in a pipelined analog-to-digital converter according to some implementations.

FIG. 3 is a diagram illustrating an example of a second stage circuit included in a pipelined analog-to-digital converter according to some implementations. In FIG. 3, a second stage circuit 200 may include a first input switch SW1, a second input switch SW2, a residue amplifier 210, a comparison circuit 220, a SAR logic circuit (SARLG) 230, and a digital-to-analog converter (DAC) 240.

The first input switch SW1 may be turned on in response to a sampling signal SMP to apply the residue voltage VRS to an input terminal of the residue amplifier 210. The second input switch SW2 may be turned on in response to a conversion signal CNV to apply a comparison voltage VC to the input terminal of the residue amplifier 210. As will be described below with reference to FIG. 6, the sampling signal SMP may be activated in a sampling period and the conversion signal CNV may be activated in a conversion period following the sampling period.

The residue amplifier 210 may sequentially amplify the residue voltage VRS and the comparison voltage VC to sequentially generate an amplified residue voltage AVRS and an amplified comparison voltage AVC. The residue amplifier 210 may be implemented as an amplifier with an open-loop structure and has a fixed gain Ao without gain calibration. As a result, one residue amplifier 210 may be utilized to sequentially amplify the residue voltage VRS and the comparison voltage VC with the same gain Ao.

The comparison circuit 220 may compare the amplified residue voltage AVRS and the amplified comparison voltage AVC to generate a comparison result signal SCR. In some implementations, the comparison circuit 220 may include a first comparison input switch SW3, a second comparison input switch SW4, and a comparator 222.

The first comparison input switch SW3 may be turned on in response to the sampling signal SMP to apply the amplified residue voltage AVRS to a positive input terminal (+) of the comparator 222. The positive input terminal (+) of the comparator 222 may be connected to a capacitor CS. The second comparison input switch SW4 may be turned on in response to the conversion signal CNV to apply the amplified comparison voltage AVC to a negative input terminal (−) of the comparator 222.

The comparator 222 may compare the amplified residue voltage AVRS and the amplified comparison voltage AVC to generate a compare result signal SCR. The comparison result signal SCR may have a first logic level (e.g., a logic high level) when the amplification residue voltage AVRS is higher than the amplification comparison voltage AVC and a second logic level (e.g., a logic low level) when the amplification residue voltage AVRS is lower than the amplification comparison voltage AVC.

The SAR logic circuit 230 may generate a plurality of control signals CTR for a binary search conversion based on the comparison result signal SCR. The binary search conversion will be described below with reference to FIGS. 7 and 8. The number of the plurality of control signals CTR may be (M+N) or N as will be described further with reference to FIGS. 15 and 16. The N control signals CTR after the binary search conversion is terminated may be provided as the second output signal DO2 including the N lower bits of the digital output code DCODE.

The digital-to-analog converter 240 may generate the comparison voltage VC based on the plurality of control signals CTR. In some implementations, the digital-to-analog converter 240 may be implemented as a capacitor digital-to-analog converter as will be described below with reference to FIG. 4.

Figure 4:
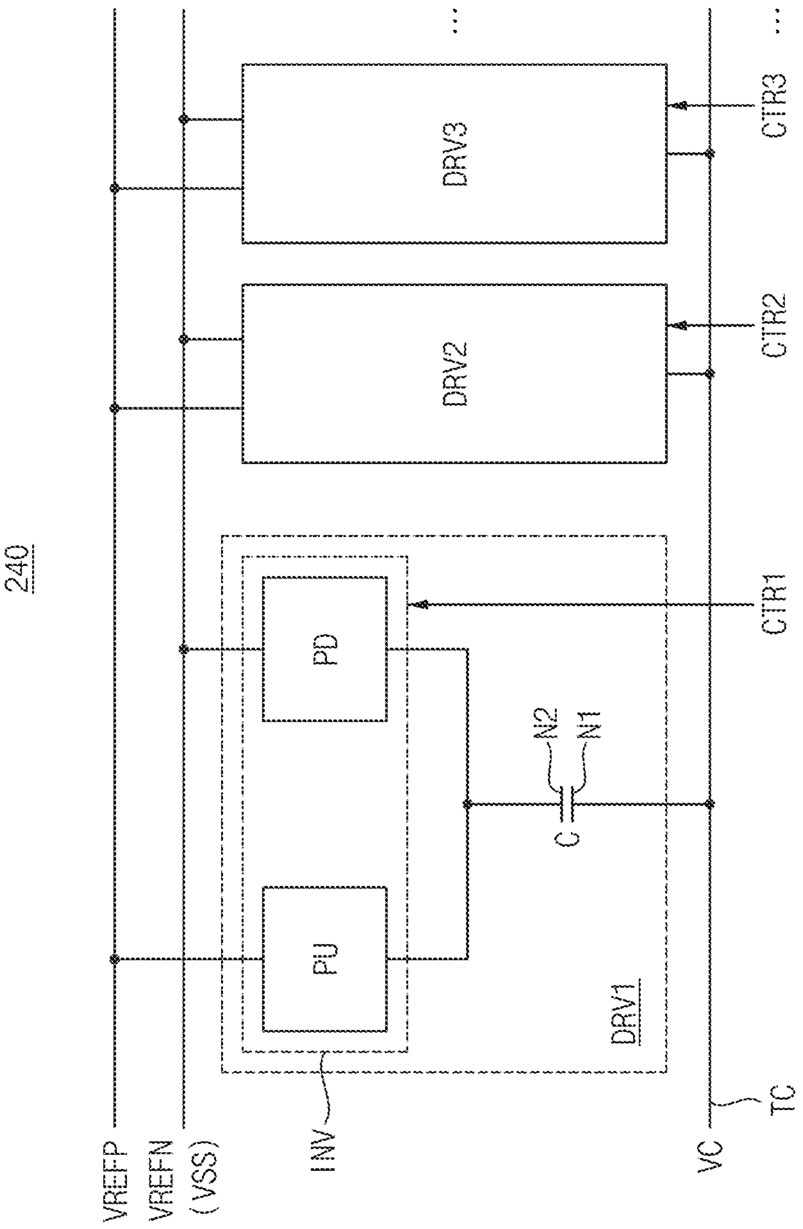
FIG. 4 is a diagram illustrating an example of a digital-to-analog converter included in the second stage circuit of FIG. 3 according to some implementations.

FIG. 4 is a diagram illustrating an example of a digital-to-analog converter included in the second stage circuit of FIG. 3 according to some implementations. In FIG. 4, a capacitor digital-to-analog converter (CDAC) 240 may include a plurality of drivers DRV1, DRV2 and DRV3. Although three drivers are shown in FIG. 4 for convenience of illustration and description, but the number of drivers may be varied depending on the resolution, or number of bits, of the digital output code DCODE.

Each of the plurality of drivers DRV1, DRV2 and DRV3 may include a capacitor C and an inverter INV. In FIG. 4, an example configuration of one driver DRV1 is shown and other drivers DRV2 and DRV3 may have similar configurations to driver DRV1.

The capacitor C may have a first capacitor node N1 connected to a control terminal TC and a second capacitor node N2 connected to the inverter INV. The control terminal TC corresponds to a terminal that outputs the comparison voltage VC.

The inverter INV may include a pull-up unit PU connected to a first reference voltage VREFP and a pull-down section PD connected to a second reference voltage VREFN lower than the first reference voltage VREFP. For example, the first reference voltage VREFP may have a positive voltage level and the second reference voltage VREFN may be a ground voltage VSS. The second capacitor node N2 of the capacitor C may be driven by turning on one of the pull-up unit PU and the pull-down unit PD.

Figure 5:
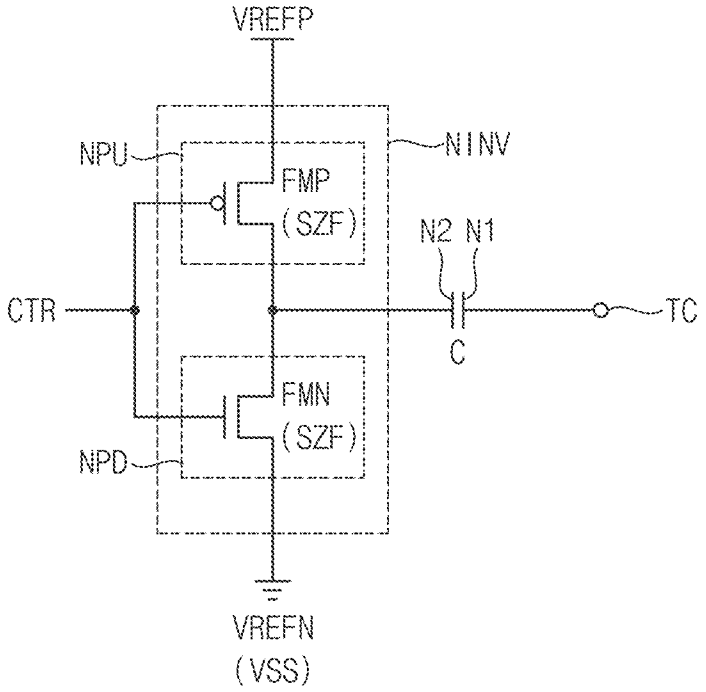
FIG. 5 is a diagram illustrating an example of an inverter included in the digital-to-analog converter of FIG. 4 according to some implementations.

FIG. 5 is a diagram illustrating an example of an inverter included in the digital-to-analog converter of FIG. 4 according to some implementations. A typical normal inverter NINVis shown in FIG. 5, but the configuration of the inverter may be varied. In some implementations, the digital-to-analog converter 240 of FIG. 4 may be implemented as a split inverter as will be described below with reference to FIGS. 21 through 25.

The normal inverter NINV may include a full PMOS transistor FMP having a full size SZF and a full NMOS transistor FMN having the full size SZF. The full size SZF of the full PMOS transistor FMP and the full size SZF of the full NMOS transistor FMN may be the same or may be different. Here, the size of a transistor refers to the ratio (W/L) of the width (W) to the length (L) of the transistor channel.

In the normal inverter NINV, the full PMOS transistor FMP corresponds to the pull-up unit NPU and a full NMOS transistor FMN corresponds to the pull-down unit NPD. A control signal CTR is applied in common to the gate of the full PMOS transistor FMP and the gate of the full NMOS transistor FMN. Depending on the voltage level of the control signal CTR, one of the full PMOS transistor FMP and the full NMOS transistor FMN may be turned on complementarily. The voltage at the control terminal TC may be initialized with the full NMOS transistor FMN turned on. When the full PMOS transistor FMP is turned on in the subsequent conversion process, the comparison voltage VC of the control terminal TC may be boosted by a voltage proportional to the capacitance of the capacitor C.

Figure 6:
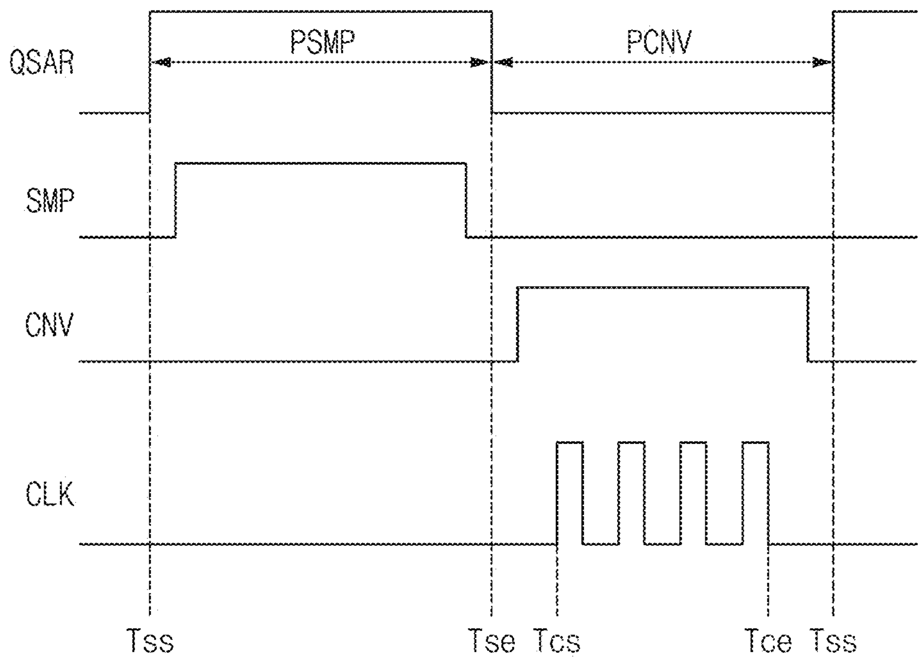
FIG. 6 is a diagram illustrating an example of an operation of an analog-to-digital converter of successive approximation register (SAR) type according to some implementations.

FIG. 6 is a diagram illustrating an example of an operation of an analog-to-digital converter of successive approximation register (SAR) type according to some implementations. In FIG. 6, a mode clock signal QSAR may indicate a sampling period PSMP and a conversion period P. The mode clock signal QSAR may be an external signal applied to a pipelined analog-to-digital converter (e.g., 10 in FIG. 1). In some implementations, the mode clock signal QSAR may have a logic high level in the sampling period PSMP and a logic low level in the conversion period PCNV. However, the present disclosure is not limited thereto and some implementations may be implemented in the opposite manner. In some implementations, the length of the sampling period PSMA and the length of the conversion period PCNV may be different from each other. For example, the length of the conversion period PCNV may be longer than the length of the sampling period PSMP, but not limited thereto. In some implementations, the length of the sampling period PSMP and the length of the conversion period PCNV may be the same.

The sampling signal SMP may be activated during the sampling period PSMP and the conversion signal CNV may be activated during the conversion period PCNV following the sampling period PSMP. The first input switch SW1 and the second input switch SW2, as described with reference to FIG. 3, may be sequentially turned on based on the sampling signal SMP and the conversion signal CNV, such that the residue voltage VRS and the comparison voltage VC may be sequentially applied to the residue amplifier 210.

A clock signal CLK may be an internal clock signal generated internally in the pipelined analog-to-digital converter 10 based on the mode clock signal QSAR. In some implementations, the clock signal CLK may include m cycles in the conversion period PCNV, and FIG. 6 illustrates an example where m is 4 for simplicity, but the value of m may vary depending on the resolution of the second stage circuit 200.

The sampling period PSMP corresponds to a first time interval Tss~Tse between a sampling start time point Tss and a sampling end time point Tse. The conversion period PCNV may be divided into a second time interval Tse~Tcs between the sampling end time point Tse and the conversion start time point Tcs, a third time interval Tcs~Tce between the conversion start time point Tcs and a conversion end time point Tce, and a fourth time interval Tce~Tss between the conversion end time point Tce and the sampling start time point Tss of the next cycle. In the following, the operation of the second stage circuit 200 of FIG. 3 during the first through fourth time periods will be described.

In the first time interval Tss~Tse, the first input switch SW1 is turned on and the residue voltage VRS is applied to the input terminal of the residue amplifier 210. The residue amplifier 210 amplifies the residue voltage VRS to generate the amplified residue voltage AVRS, and the first comparison input switch SW3 is turned on such that the amplified residue voltage AVRS is sampled at the positive input terminal (+) of the comparator 222.

In the second time step Tse~Tcs, the second input switch SW2 is turned on and the comparison voltage VC is applied to the input terminal of the residue amplifier 210.

In the third time interval Tcs~Tce, a binary search conversion is performed to sequentially determine the logic levels of the plurality of control signals CTR, i.e., the plurality of bits of the digital output signal DCODE, from the most significant bit to the least significant bit, one bit per one cycle of the clock signal CLK. At this time, each of the plurality of drivers included in the digital-to-analog converter 240 drives the second capacitor node C2 by turning on one of the pull-up unit PU connected to the first reference voltage VREFP and the pull-down unit PD connected to the second reference voltage VREFN depending on the logic level of corresponding control signal among the plurality of control signals CTR. Accordingly, the comparison voltage VC of the control terminal TC connected to the first capacitor node N1 of the capacitor is varied according to the determined logic levels of the corresponding control signal.

In the fourth time interval Tce~Tss, the logic levels of the plurality of control signals CTR are reset for conversion of the next data included in the analog input voltage VI.

Figure 7:
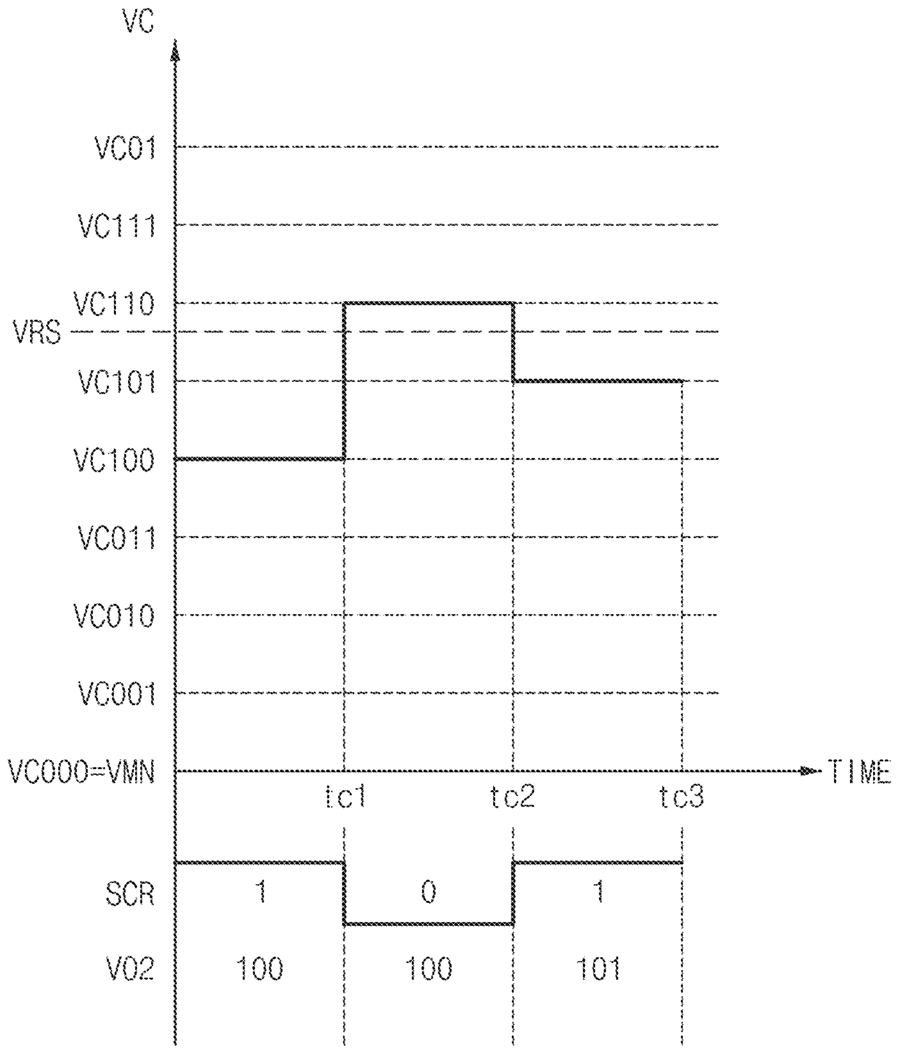
FIGS. 7 and 8 are diagrams illustrating an example of a binary search conversion of a second stage circuit configured to perform an analog-to-digital conversion of SAR type according to some implementations.
Figure 8:
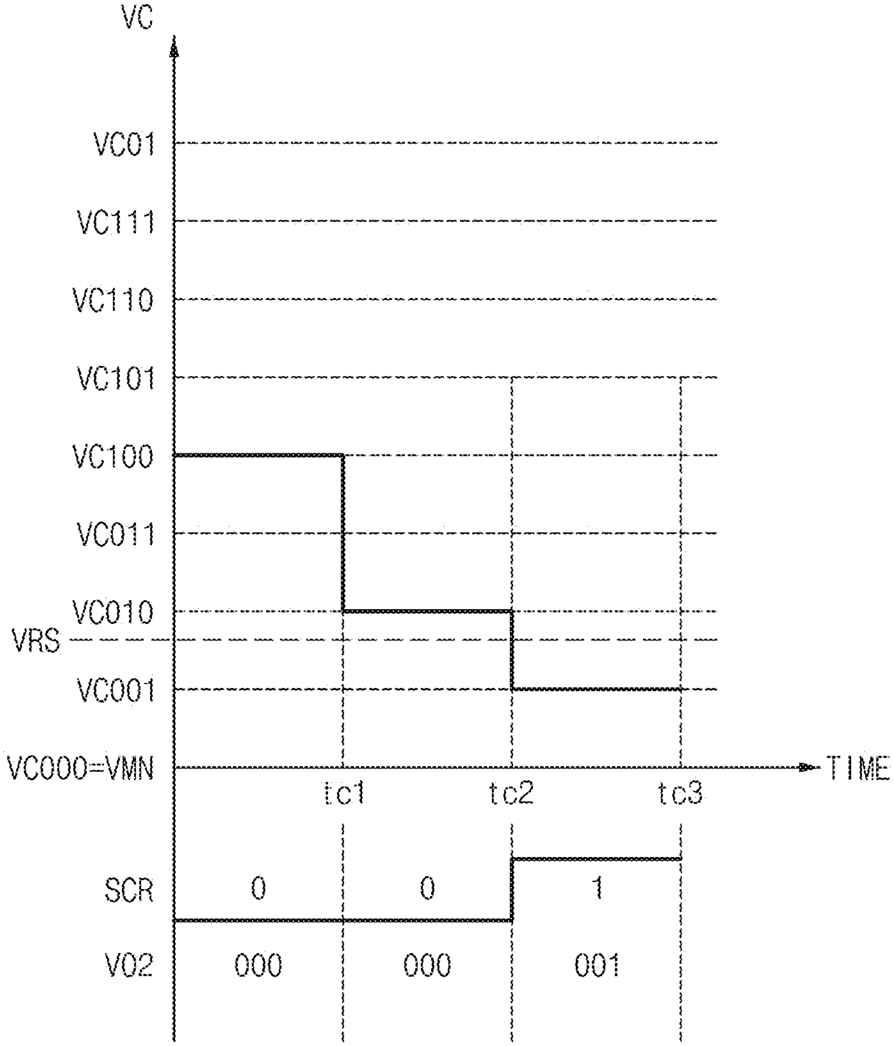

FIGS. 7 and 8 are diagrams showing examples of a binary search conversion of a second stage circuit configured to perform an analog-to-digital conversion of SAR type according to example embodiments. In FIGS. 7 and 8, the vertical axis represents the comparison voltage VC generated by the digital-to-analog converter 240 and the horizontal axis represents time. VC01 indicates the maximum voltage level of residue voltage VRS that the second stage circuit 200 is capable of converting, and VMN indicates the minimum voltage level of residue voltage VRS that the second stage circuit 200 is capable of converting. For example, VMN may correspond to 0 volts. VC000 through VC111 represent voltage levels of the comparison voltage VC output by the digital-to-analog converter 240.

In FIGS. 7 and 8, example cases of the binary search conversion are shown where the second output signal DO2 of the second stage circuit 200 has a resolution of 3 bits. The SAR logic circuit 230 of FIG. 3 may sequentially determine the logic levels from the third control signal CTR3 corresponding to the most significant bit to the first control signal CTR1 corresponding to the least significant bit at each of the first through third time points Tc1 through Tc3, one by one. The logic level of each control signal is determined by the relative magnitudes of the amplified residue voltage AVRS and the amplified comparison voltage AVC applied to the comparator 220. When the residue voltage VRS is higher than the comparison voltage VC, the compare result signal SCR has a logic high level (i.e., a value of ‘1’). When the residue voltage VRS is lower than the comparison voltage VC, the comparison result signal SCR has a logic low level (i.e., a value of ‘O’). In FIGS. 7 and 8, the logic level of the comparison result signal SCR determines the increase or decrease of the comparison voltage VC, and the variation amount of the comparison voltage VC may decrease by ½ with each lower bit. To achieve this variation of the VC, the capacitance of the capacitors included in the plurality of drivers may be implemented to decrease sequentially by ½ from the driver corresponding to the most significant bit to the driver corresponding to the least significant bit.

Through such a binary search conversion, the N lower bits of the second output signal DO2 may be determined sequentially from the most significant bit to the least significant bit. FIGS. 7 and 8 show the conversion results for the case of N=3. The residue voltage VRS in FIG. 7 may be converted into three lower bits corresponding to “101”, and the residue voltage VRS in FIG. 8 may be converted into three lower bits corresponding to “001”.

Figure 9:
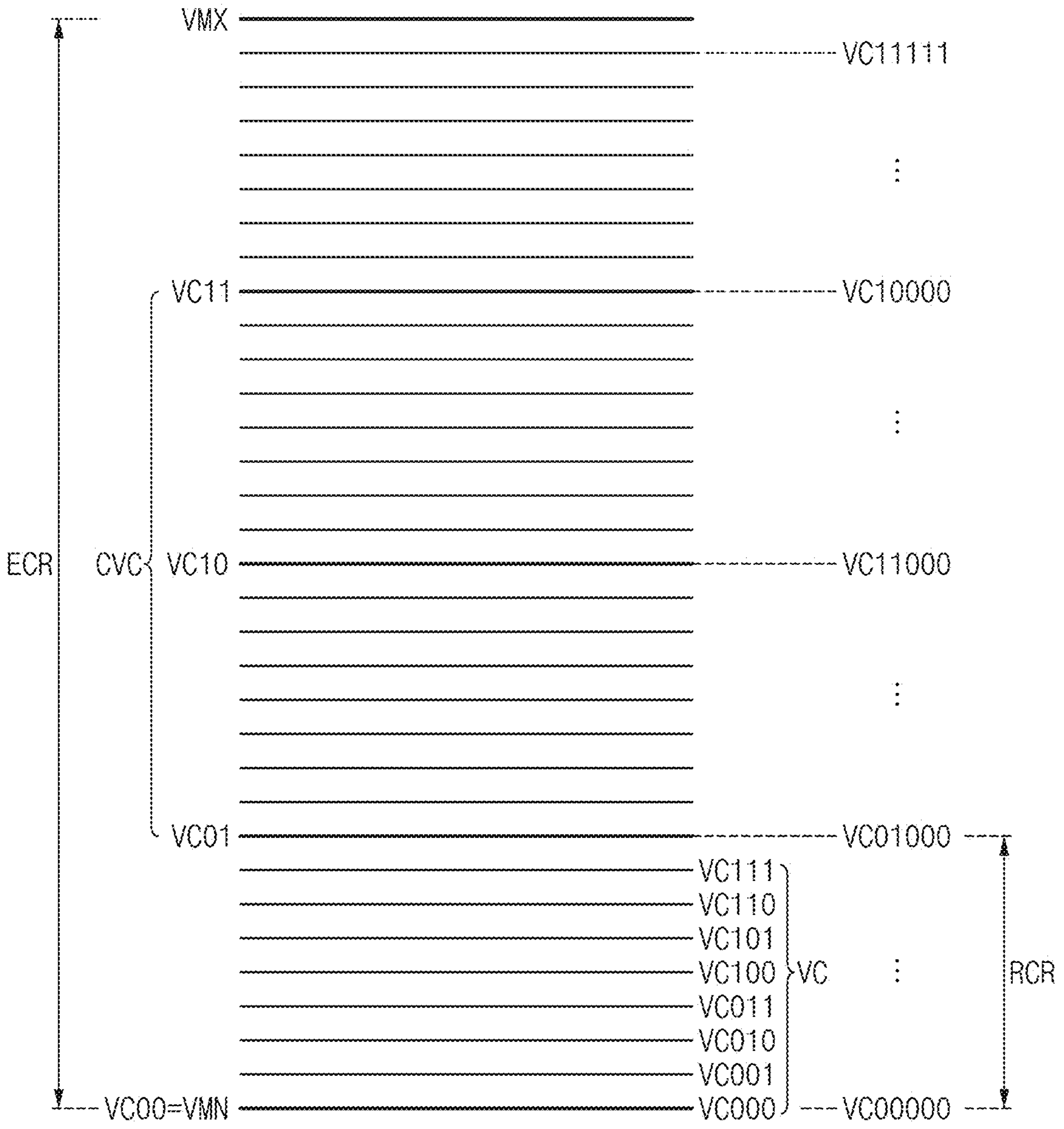
FIG. 9 is a diagram illustrating an example of a coarse comparison voltage and a comparison voltage of a pipelined analog-to-digital converter according to some implementations.

FIG. 9 is a diagram illustrating an example of a coarse comparison voltage and a comparison voltage of a pipelined analog-to-digital converter according to some implementations. FIG. 9 illustrates an example where M=2 and N=3, i.e., where the first stage circuit 100 generates the two higher bits of the digital output code DCODE and the second stage circuit 200 generates the three lower bits of the digital output code DCODE.

In FIG. 9, the analog input voltage VI may have a voltage level in a full conversion range ECR between a minimum voltage VMN and a maximum voltage VMX. For pipelined analog-to-digital conversion, as will be described below with reference to FIGS. 19 and 20, the first stage circuit 100 may have a configuration capable of generating a coarse comparison voltage CVC having relatively large-scale voltage levels VC00 to VC11, and the second stage circuit 200 may have a configuration capable of generating a comparison voltage VC having relatively small-scale voltage levels VC00000 to VC11111.

According to some implementations, the digital-to-analog converter 240 included in the second stage circuit 200 may vary the voltage level of the comparison voltage VC within a reduced conversion range RCR that is reduced by a factor of $2^M$ (e.g., M=2) in comparison with the full conversion range ECR of the analog input voltage VI while performing the binary search conversion. As shown in FIG. 9, the first stage circuit 100 compares the analog input voltage VI to the course comparison voltage CVC having voltage levels VC01, VC10 and VC11 to generate the two higher bits of the digital output code DCODE, and the second stage circuit 200 may compare the residue voltage VRS to the comparison voltage VC having voltage levels VC001, VC010, VC011, VC100, VC101, VC110 and VC111 to generate the three lower bits of the digital output code DCODE.

Figure 10:
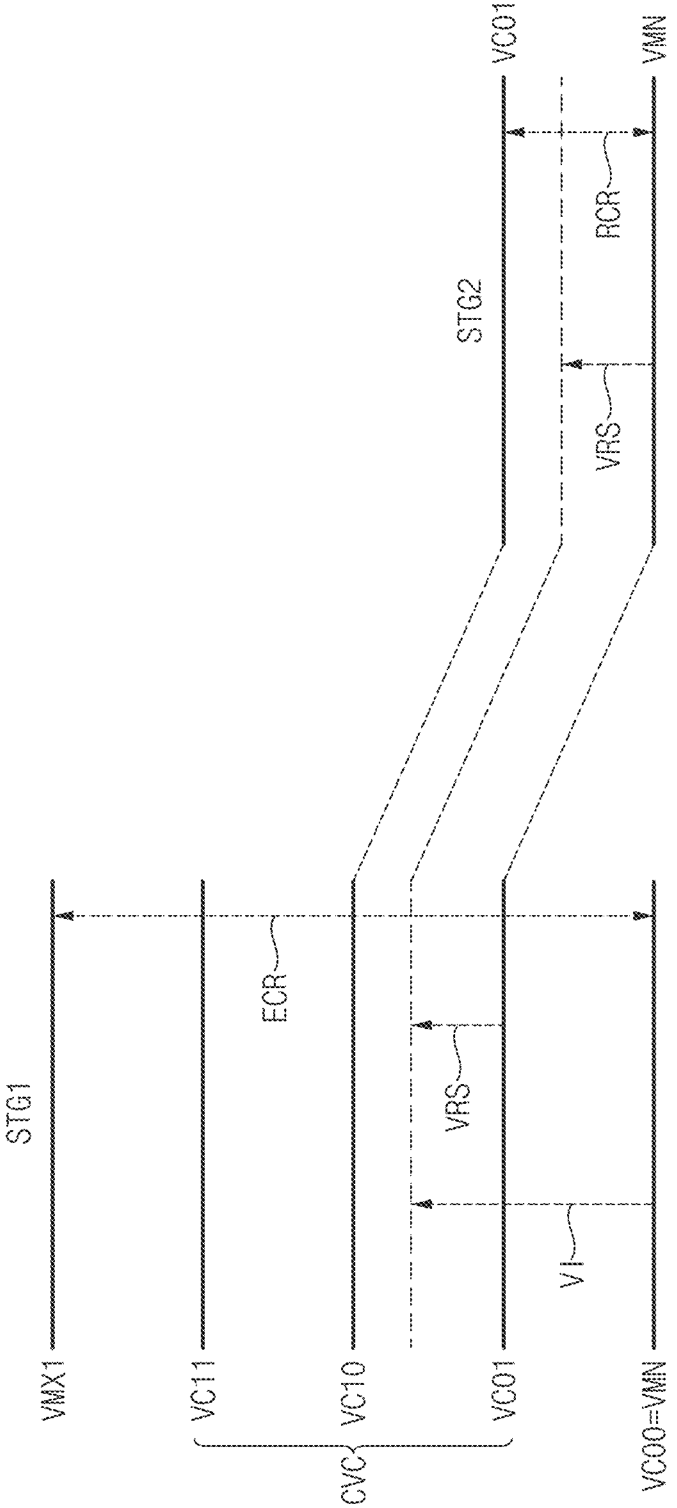
FIG. 10 is a diagram illustrating an example of a residue voltage of a pipelined analog-to-digital converter according to some implementations.
Figure 11:
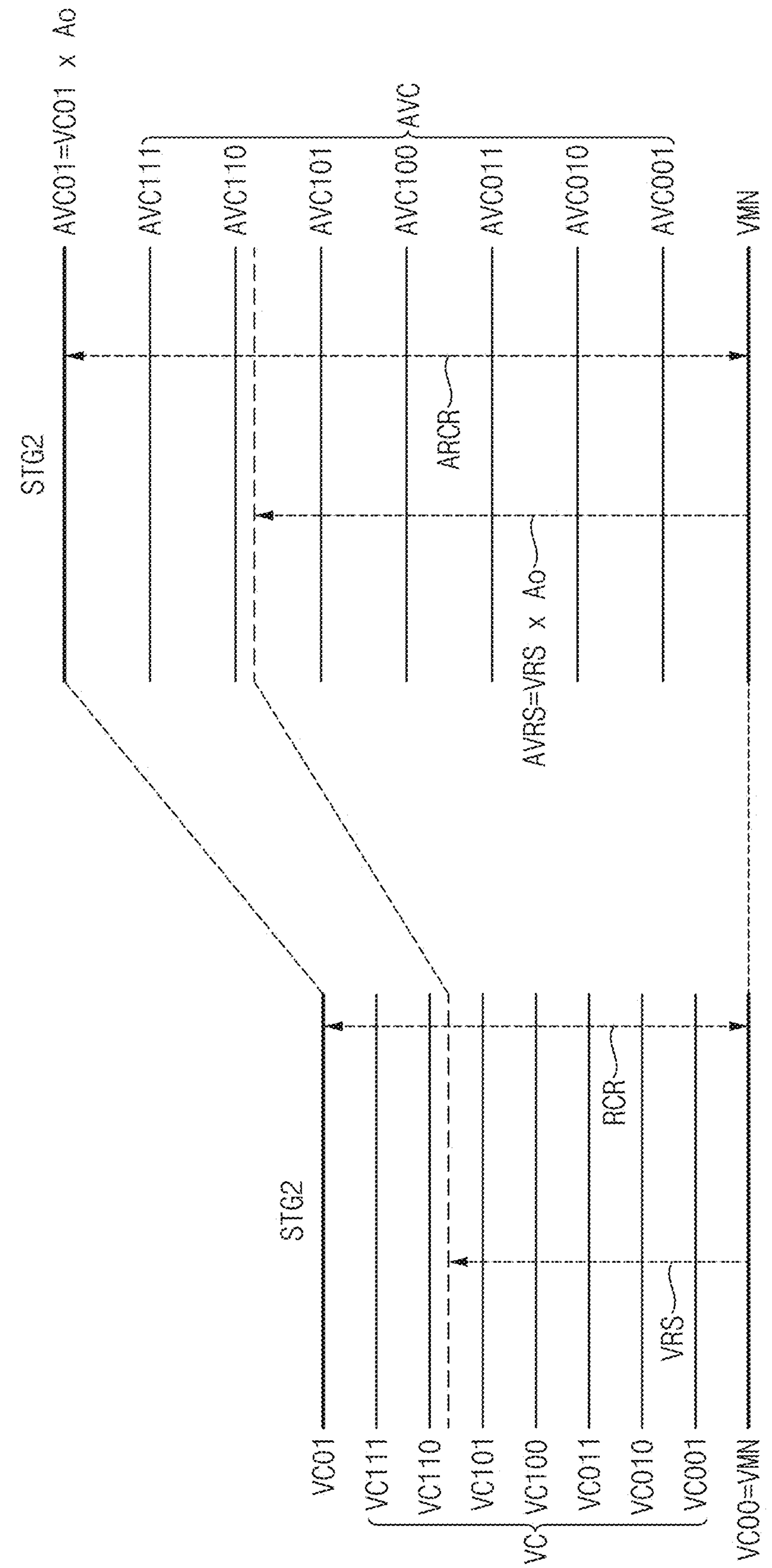
FIG. 11 is a diagram illustrating an example of an amplification operation of a second stage circuit included in a pipelined analog-to-digital converter according to some implementations.

FIG. 10 is a diagram illustrating an example of a residue voltage of a pipelined analog-to-digital converter according to some implementations, and FIG. 11 is a diagram illustrating an example of an amplification operation of a second stage circuit included in a pipelined analog-to-digital converter according to some implementations. In FIG. 10, a first stage circuit STG1 may compare an analog input voltage VI with voltage levels VC01, VC10 and VC11 of a course comparison voltage CVC to generate two higher bits. For example, as shown in FIG. 10, when the analog input voltage VI is between V01 and V10, the first stage circuit STG1 may generate two higher bits corresponding to '01'.

Meanwhile, the first stage circuit STG1 may generate the residue voltage VRS by subtracting the course comparison voltage VC01 corresponding to the two higher bits ('01') from the analog input voltage VI. As a result, the analog input voltage VI input to the first stage circuit STG1 may vary over the full conversion range ECR, and the residue voltage VRS input to the second stage circuit STG2 may vary within the reduced conversion range RCR that is reduced by a factor of $2^M$ (e.g., M=2) in comparison with the full conversion range ECR.

In FIG. 11, the residue amplifier 210 of the second stage circuit STG2 may amplify the residue voltage VRS and the comparison voltage VC with the same gain Ao to generate an amplified residue voltage AVRS and an amplified comparison voltage AVC. The comparison voltage VC is varied to have one of the voltage levels VC001, VC010, VC011, VC100, VC101, VC110, and VC111 during the binary search conversion, and the amplified comparison voltage AVC is varied to have one of the voltage levels AVC001, AVC010, AVC011, AVC100, AVC101, AVC110, and AVC111. The amplified conversion range ARCR of the amplified comparison voltage AVC corresponds to the product of the reduced conversion range RCR of the comparison voltage VC and the gain Ao of the residue amplifier 210.

Figure 12:
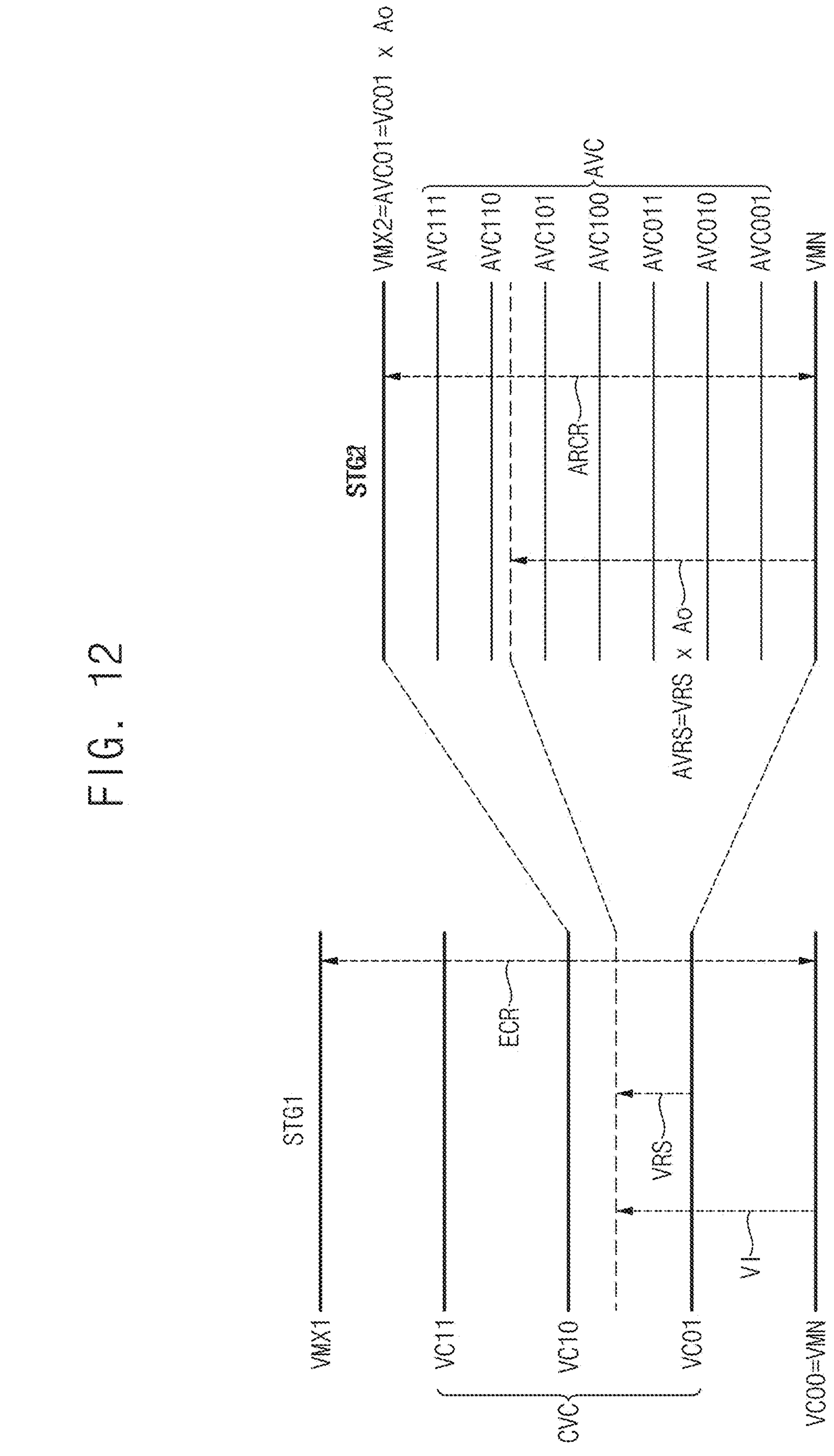
FIG. 12 is a diagram illustrating examples of voltage ranges of a first stage circuit and a second stage circuit included in a pipelined analog-to-digital converter according to some implementations.

FIG. 12 is a diagram illustrating example voltage ranges of a first stage circuit and a second stage circuit included in a pipelined analog-to-digital converter according to some implementations. In FIG. 12, the first stage circuit STG1 performs analog-to-digital conversion by comparing the course comparison voltage CVC corresponding to the full conversion range ECR with the analog input voltage VI, the second stage circuit STG2 performs analog-to-digital conversion by comparing the amplified comparison voltage AVC corresponding to an amplified conversion range ARCR with the amplification residue voltage AVRS. The reduced conversion range RCR is reduced by a factor of $2^M$ in comparison with the full conversion range ECR, and the amplified conversion range ARCR is amplified by the factor of the gain Ao of the residue amplifier 210 in comparison with the reduced conversion region RCR.

As such, since the second stage circuit STG2 of the pipeline analog-to-digital converter according to some implementations amplifies the residue voltage VRS and the comparison voltage VC with the same gain Ao, the residue amplifier 210 may be implemented in an open-loop structure and thus the gain calibration of the residue amplifier 210 is not required.

Figure 13:
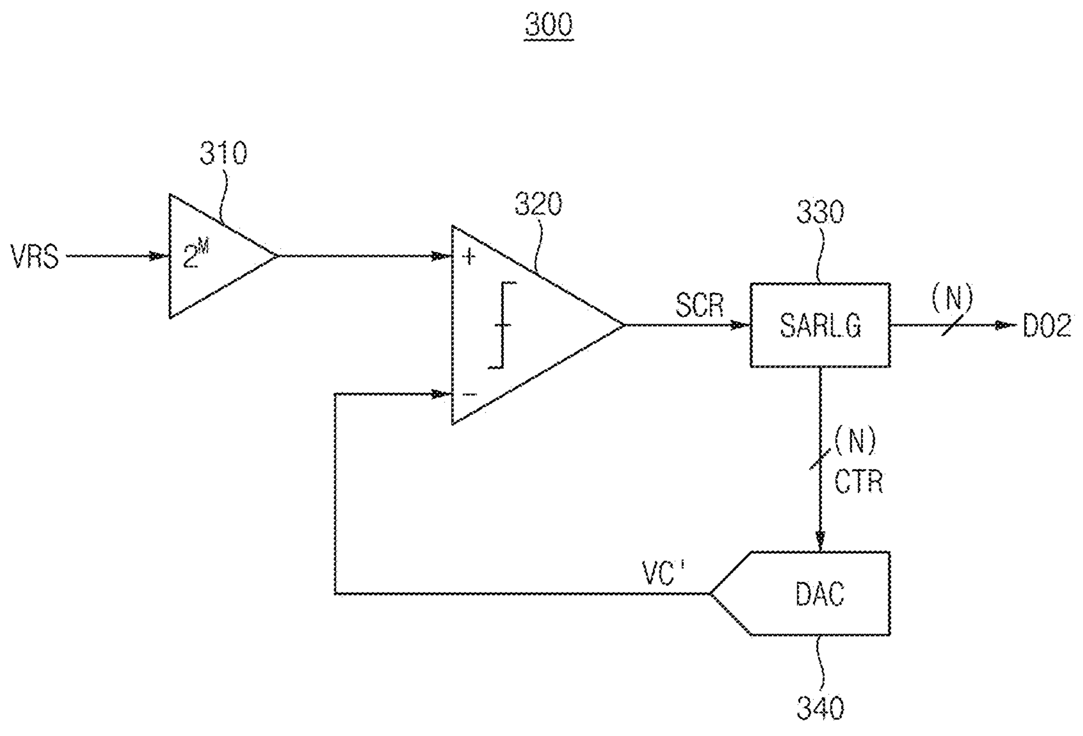
FIG. 13 is a diagram illustrating an example of a second stage circuit included in a pipelined analog-to-digital converter according to some implementations.
Figure 14:
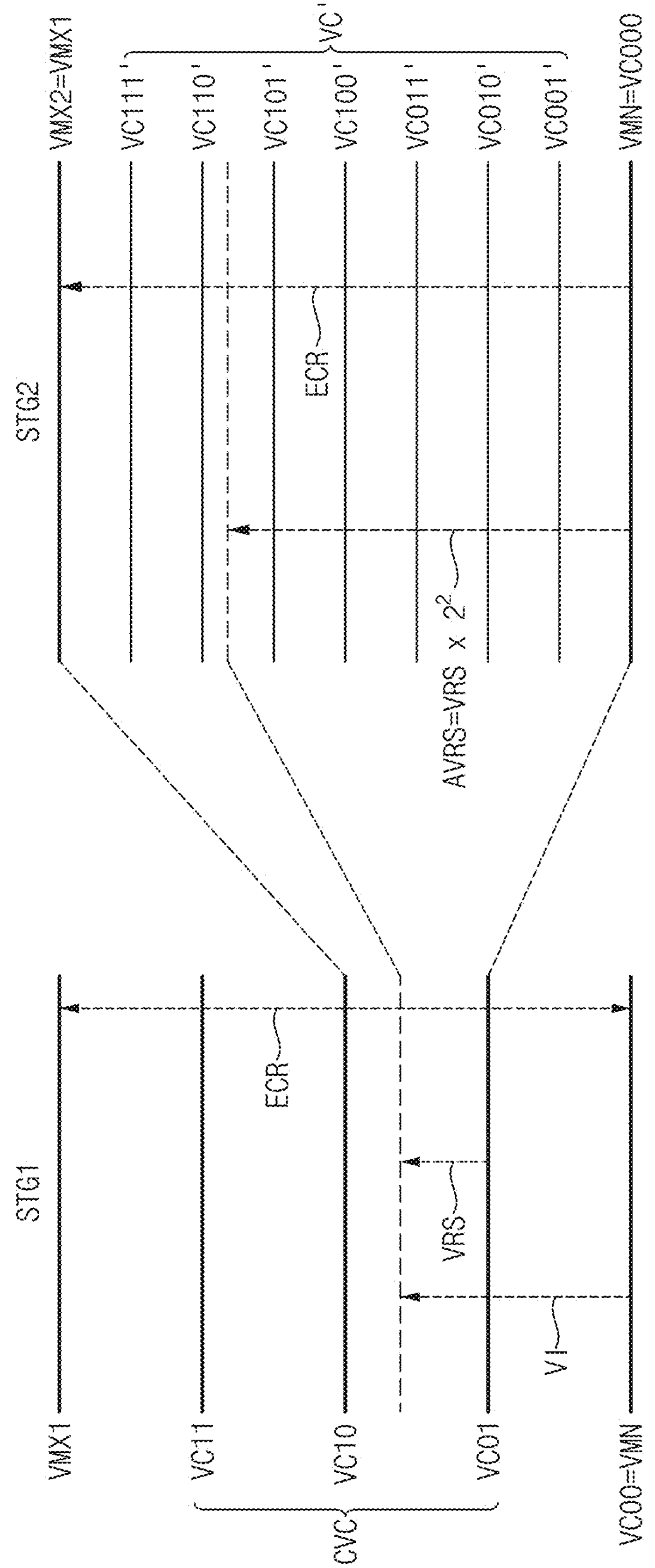
FIG. 14 is a diagram illustrating examples of voltage ranges of a pipelined analog-to-digital converter including a second stage circuit according to some implementations.

FIG. 13 is a diagram illustrating an example of a second stage circuit included in a pipelined analog-to-digital converter according to some implementations, and FIG. 14 is a diagram illustrating examples of voltage ranges of a pipelined analog-to-digital converter including a second stage circuit according to some implementations. The configuration of FIG. 13 is similar to the configuration of FIG. 3, the voltage ranges of FIG. 14 are similar to the voltage ranges of FIG. 12, and thus redundant description is omitted.

In FIG. 13, a second stage circuit 300 includes a residue amplifier 310, a comparator 320, a SAR logic circuit (SARLG) 330, and a digital-to-analog converter (DAC) 340.

In FIG. 14, the residue amplifier 310 has to amplify the residue voltage VRS with a gain of $2^M$ to cover the full conversion range ECR, and the digital-to-analog converter 340 has to generate the comparison voltage VC' to cover the full conversion range ECR.

The residue amplifier 310, which is the performance bottleneck in a fast-operating SAR-type pipeline analog-to-digital converter, requires a sophisticated gain of $2^M$ and a wide bandwidth. Implementing the residue amplifier 310 in a closed-loop structure requires high gain (about 100 dB or more) and wide bandwidth, which results in high power consumption. On the other hand, implementing the residue amplifier 310 as an open-loop structure requires digital calibration of the gain to compensate for gain error due to process, voltage, and temperature (PVT) variations, which also results in high power consumption.

According to some implementations, power consumption may be reduced by scaling down the full-scale of the digital-to-analog converter 240 by $2^M$ instead of the gain of the residue amplifier 210 in FIG. 3, and comparing the residue voltage VRS and the comparison voltage VC after sequentially amplifying the residue voltage VRS and the comparison voltage VC using the same residue amplifier 210 having an open-loop structure that does not require gain calibration or gain error compensation.

Figure 15:
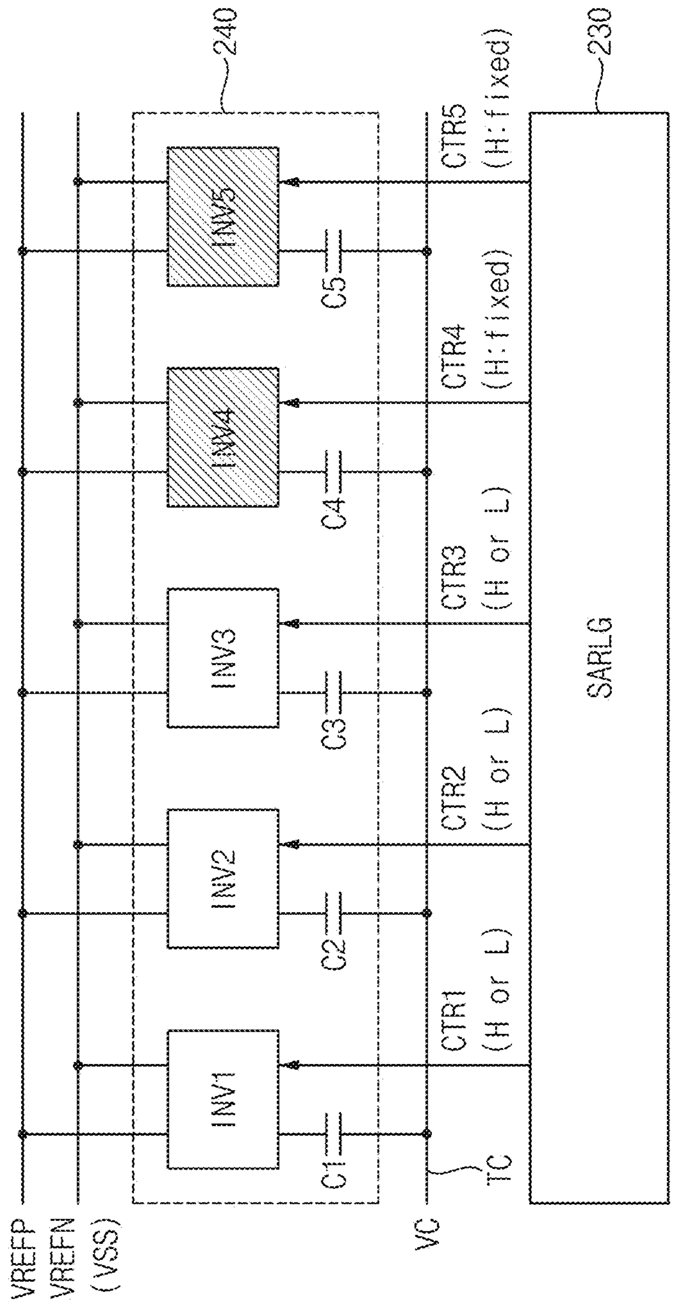
FIGS. 15 and 16 are diagrams illustrating examples of generating a comparison voltage of a second stage circuit included in a pipelined analog-to-digital converter according to some implementations.
Figure 16:
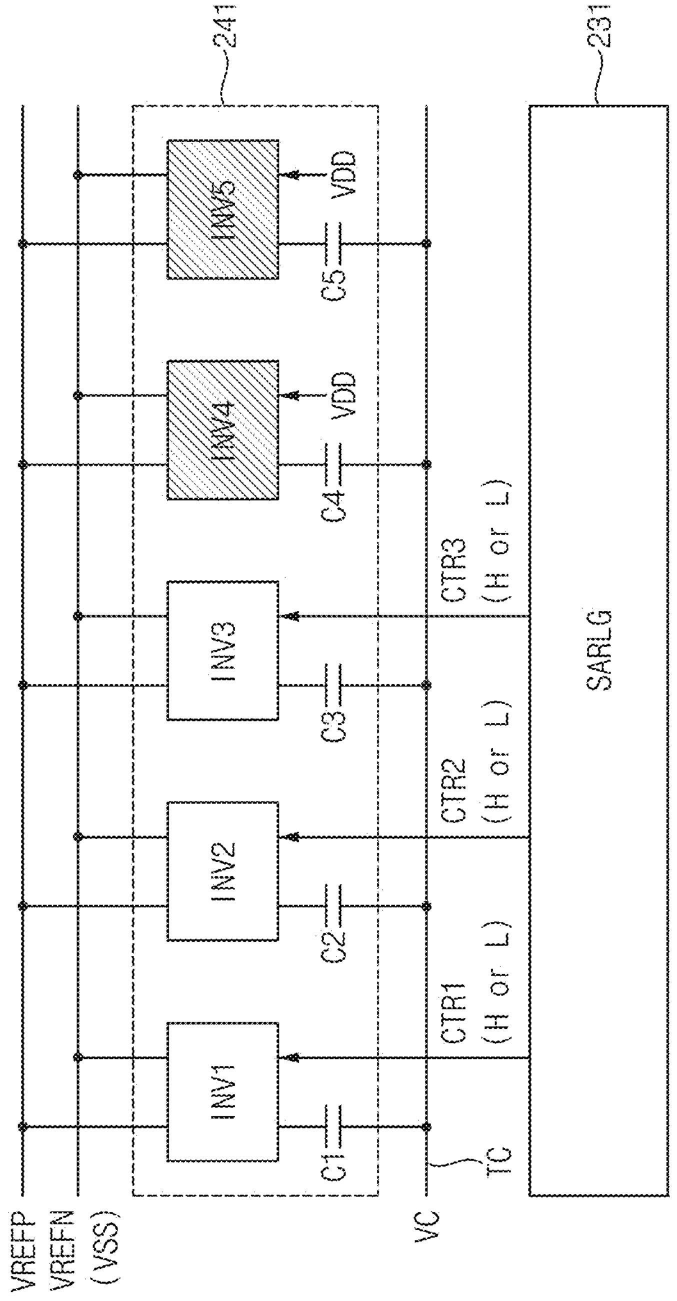

FIGS. 15 and 16 are diagrams illustrating an example of generating a comparison voltage of a second stage circuit included in a pipelined analog-to-digital converter according to some implementations. FIGS. 15 and 16 illustrate SAR logic circuits (SARLG) 230 and 231, and capacitor digital-to-analog converters 240 and 241 of the second stage circuit (STG2) 200 described with reference to FIGS. 3 through 12, and the repeated description is omitted. FIGS. 15 and 16 illustrate an example where M=2 and N=3, i.e., where the first stage circuit 100 generates the two higher bits of the digital output code DCODE and the second stage circuit 200 generates the three lower bits of the digital output code DCODE.

In FIGS. 15 and 16, each of the capacitor digital-to-analog converters 240 and 241 may include first to fifth inverters INV1 to INV5 and first to fifth capacitors C1 to C5 corresponding to (M+N) bits (e.g., five bits) of the digital output code DCODE. Each inverter INVi (i=1~5) and each capacitor Ci may correspond to a respective driver DRVi, as described with reference to FIG. 4.

To enable the binary search conversion of FIGS. 7 and 8 to be performed, the capacitance of the second capacitor C2 corresponds to $2^1$ of the capacitance of the first capacitor C1 corresponding to the least significant bit of the digital output code DCODE, and the capacitance of the fifth capacitor C5 corresponding to the most significant bit of the digital output code DCODE corresponds to $2^4$ of the capacitance of the first capacitor C1. In other words, Ci satisfies $C1\times2^{i-1}$, where Ci indicates the capacitance of the i-th capacitor.

As shown in FIGS. 15 and 16, each of the digital-to-analog converters 240 and 241 included in the second stage circuit 200 may have a configuration capable of varying the voltage level of the comparison voltage VC within the full conversion range ECR of the analog input voltage VI. In other words, each of the digital-to-analog converters 240 and 241 may include five drivers corresponding to (M+N=5) bits of the digital output code DCODE (e.g., M=2, N=3).

Each of the digital-to-analog converters 240 and 241 may vary the voltage level of the comparison voltage VC within the reduced conversion range RCR that is reduced by a factor of $2^M$ in comparison with the full conversion range ECR of the analog input voltage VI while performing a binary search conversion. Each of the digital-to-analog converters 240 and 241 may have a configuration corresponding to (M+N) bits, but the voltage level of the comparison voltage VC may be varied within the reduced conversion range RCR by disabling the inverters INV4 and INV5 of the drivers corresponding to the M higher bits. In FIGS. 15 and 16, the inverters INV4 and INV5 being disabled are shown hatched.

In some implementations, as shown in FIG. 15, the SAR logic circuit 230 may fix the fourth control signal CTR4 and the fifth control signal CTR5, corresponding to the two higher bits of the digital output code DCODE, to a logic high level H. In this case, the fourth inverter INV4 and the fifth inverter INV5 may be disabled in such a way that the pull-down units are always turned on. On the other hand, the SAR logic circuit 230 may vary the voltage level of the comparison voltage VC within the reduced conversion range RCR by changing each of the first control signal CTR1, the second control signal CTR2, and the third control signal CTR3 corresponding to the three lower bits of the digital output code DCODE to a logic low level L or a logic high level H.

As such, the SAR logic circuit 230 of FIG. 15 may vary the logic level of the comparison voltage VC within the reduced conversion range RCR, by fixing the logic levels of the fourth and fifth control signals CTR4 and CTR5 corresponding to the two higher bits among the five control signals CTR1~CTR5 and varying the logic levels of the first, second and third control signals CTR1, CTR2 and CTR3 corresponding to the three lower bits among the five control signals CTR1~CTR5.

In some implementations, as shown in FIG. 16, the SAR logic circuit 231 may generate and provide only the first control signal CTR1, the second control signal CTR2, and the third control signal CTR3 corresponding to the three lower bits of the digital output code DCODE to the digital-to-analog converter 241. Instead of the fourth control signal CTR4 and the fifth control signal CTR5, the fourth inverter INV4 and the fifth inverter INV5 corresponding to the two higher bits of the digital output code DCODE may be applied a voltage corresponding to the logic high level H, for example, the power supply voltage VDD.

As such, the SAR logic circuit 231 of FIG. 16 may generate only the N (e.g., N=3) control signals CTR1, CTR2, and CTR3 corresponding to the N lower bits, excluding the M (e.g., M=2) control signals CTR4 and CTR4 corresponding to the M higher bits, among the (M+N) control signals CTR1~CTR5 corresponding to each of the (M+N) bits of the digital output code DCODE during the binary search conversion, and provide the only the N control signals CTR1, CTR2, and CTR3 to the digital-to-analog converter 241. The voltage VDD corresponding to the logic high level H may be applied to the gates of the inverters INV4 and INV5 included in the M drivers corresponding to the M higher bits among the (M+N) drivers such that the pull down units in the inverters INV4 and INV5 may be always turned on.

Figure 17:
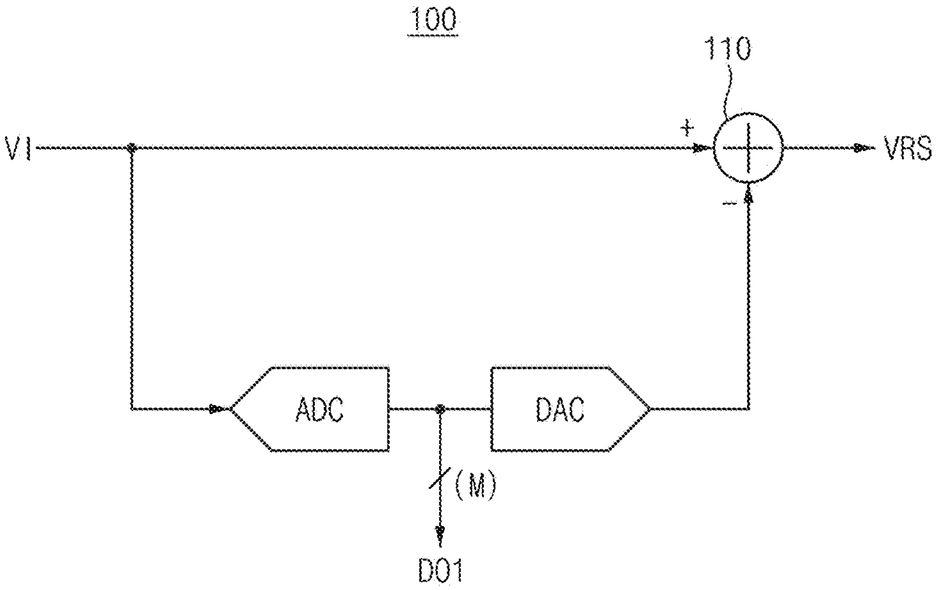
FIGS. 17 and 18 are diagrams illustrating examples of a first stage circuit included in a pipelined analog-to-digital converter according to some implementations.
Figure 18:
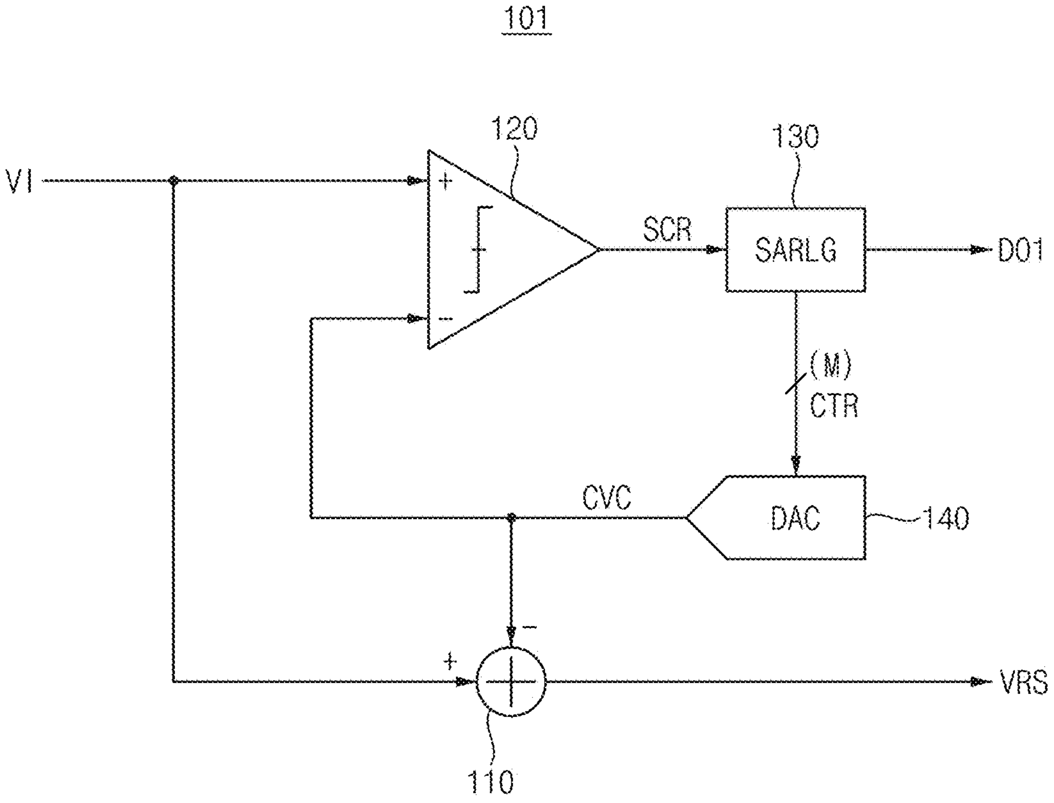

FIGS. 17 and 18 are diagrams illustrating examples of a first stage circuit included in a pipelined analog-to-digital converter according to some implementations. In FIG. 17, a first stage circuit 100 may include an analog-to-digital converter ADC, a digital-to-analog converter DAC, and a voltage subtractor 110.

The analog-to-digital converter ADC may perform an analog-to-digital conversion on an analog input voltage VI to generate a first output signal DO1 including M higher bits of a digital output code DCODE.

The digital-to-analog converter may perform a digital-to-analog conversion on the M higher bits to generate a coarse comparison voltage corresponding to the M higher bits.

The voltage subtractor 110 may subtract the course comparison voltage corresponding to the M higher bits from the analog input voltage VI to generate a residue voltage VRS.

The analog-to-digital converter ADC may perform various analog-to-digital conversions, such as flash type, sigma-delta type, SAR type, etc. FIG. 17 illustrates an implementations of the first stage circuit performing SAR-type analog-to-digital conversion.

In FIG. 17, a first stage circuit 101 may include a comparator 120, a SAR logic circuit (SARLG) 130, a digital-to-analog converter (DAC) 140, and a voltage subtractor 110.

The positive input terminal (+) of the comparator 120 may be applied an analog input voltage VI and the negative input terminal (−) of the comparator 120 may be applied the course comparison voltage CVC. The comparator 120 may compare the analog input voltage VI and the course comparison voltage CVC to generate a comparison result signal SCR. The comparison result signal SCR may have a first logic level (e.g., logic high level) when the analog input voltage VI is higher than the course comparison voltage CVC and a second logic level (e.g., logic low level) when the analog input voltage VI is lower than the course comparison voltage CVC.

The SAR logic circuit 130 may generate a plurality of control signals CTR for the binary search conversion based on the comparison result signal SCR. The plurality of control signals CTR may be M control signals corresponding to each of the M higher bits. The binary search conversion is described above with reference to FIGS. 7 and 8. The number of the plurality of control signals CTR may be (M+N) or N, as will be described with reference to FIGS. 19 and 20. The M control signals CTR after the binary search conversion is terminated may be provided as the first output signal DO1 including the M higher bits of the digital output code DCODE.

The digital-to-analog converter 140 may generate a coarse comparison voltage CVC based on the plurality of control signals CTR. In some implementations, the digital-to-analog converter 240 may be implemented as a capacitor digital-to-analog converter as described above with reference to FIG. 4. In addition, the digital-to-analog converter may provide, after the binary search conversion is terminated, the course comparison voltage (e.g., VC01 in FIG. 10) corresponding to the M higher bits to the voltage subtractor 110.

The voltage subtractor 110 may subtract the course comparison voltage corresponding to the M higher bits from the analog input voltage VI to generate the residue voltage VRS.

As such, both the first stage circuit 100 and the second stage circuit 200 included in the pipeline analog-to-digital converter 10 may perform SAR-type analog-to-digital conversion. The first stage circuit 100 may include a first digital-to-analog converter (e.g., 140 in FIG. 18) for generating the course comparison voltage CVC, and the second stage circuit 200 may include a second digital-to-analog converter (e.g., 240 in FIG. 3) for generating the comparison voltage VC. The first digital-to-analog converter and the second digital-to-analog converter may be implemented as a capacitor digital-to-analog converter, such as described with reference to FIG. 4.

As described with reference to FIG. 9, the range over which the course comparison voltage CVC generated by the first digital-to-analog converter of the first stage circuit 100 corresponds to the full conversion range ECR of the analog input voltage VI, and the range over which the comparison voltage VC generated by the second digital-to-analog converter of the second stage circuit 200 corresponds to the reduced conversion range RCR that is reduced by a factor of $2^M$ in comparison with the full conversion range ECR.

Figure 19:
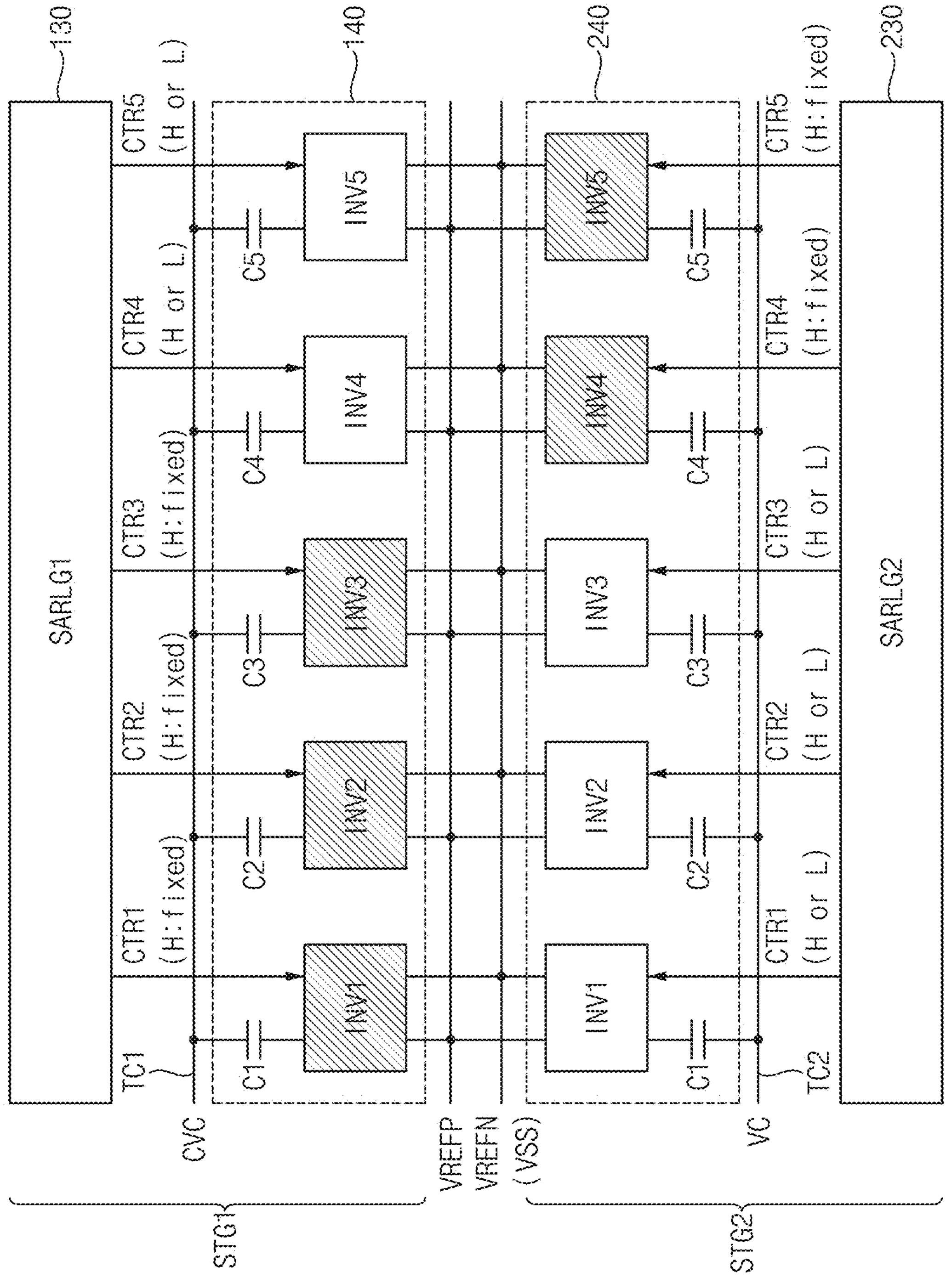
FIGS. 19 and 20 are diagrams illustrating examples of generating a coarse comparison voltage and a comparison voltage of a first stage circuit and a second stage circuit included in a pipelined analog-to-digital converter according to some implementations.
Figure 20:
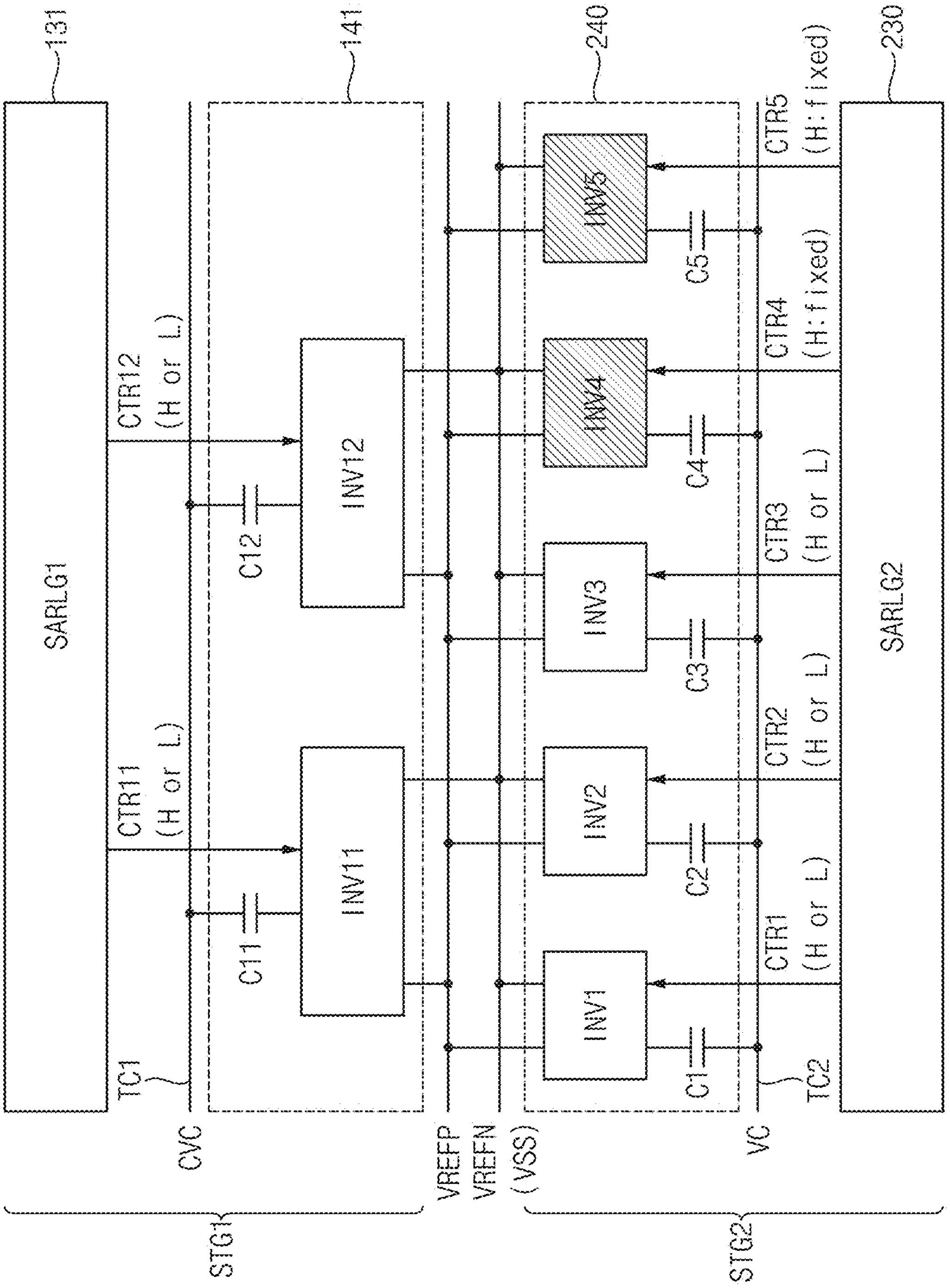

FIGS. 19 and 20 are diagrams illustrating examples of generating a coarse comparison voltage and a comparison voltage of a first stage circuit and a second stage circuit included in a pipelined analog-to-digital converter according to some implementations. FIGS. 19 and 20 illustrate a first SAR logic circuits (SARLG1) 130 or 131 and a first digital-to-analog converters 140 or 141 included in a first stage circuit STG1, and a second SAR logic circuit (SARLG2) 230 and a second digital-to-analog converter 240 included in a second stage circuit STG2. The first analog-to-digital converters 140 or 141 and the second analog-to-digital converter 240 may be implemented as capacitor digital-to-analog converters as described with reference to FIG. 4, and the repeated description is omitted. FIGS. 19 and 20 illustrate an example where M=2 and N=3, i.e., where the first stage circuit STG1 generates the two higher bits of the digital output code DCODE and the second stage circuit STG2 generates the three lower bits of the digital output code DCODE.

The first digital-to-analog converter 140 or 141 may generate a course comparison voltage CVC for SAR-type analog-to-digital conversion based on the first-stage control signals CTR1~CTR5, and the second digital-to-analog converter 240 may generate a comparison voltage VC for SAR-type analog-to-digital conversion based on the second-stage control signals CTR1~CTR5.

The first stage circuit STG1 may perform a SAR-type analog-to-digital conversion by performing a binary search conversion that sequentially determines M higher bits of the digital output code DCODE from the most significant bit to the least significant bit while varying the voltage level of the course comparison voltage CVC generated through a first control terminal TC1. The second stage circuit STG2 may perform a SAR-type analog-to-digital conversion by performing a binary search conversion that sequentially determines the N lower bits of the digital output code DCODE from the most significant bit to the least significant bit while varying the voltage level of the comparison voltage VC generated through a second control terminal TC2.

In FIG. 19, each of the first digital-to-analog converter 140 and the second digital-to-analog converter 240 may include first through fifth inverters INV1~INV5 and first through fifth capacitors C1~C5 corresponding to (M+N) bits (e.g., five bits) of the digital output code DCODE. Each corresponding inverter INVi (i=1~5) and each capacitor Ci may correspond to a respective driver DRVi as described with reference to FIG. 4.

To enable the binary search conversion of FIGS. 7 and 8 to be performed, the capacitance of the second capacitor C2 corresponds to $2^1$ of the capacitance of the first capacitor C1 corresponding to the least significant bit of the digital output code DCODE, and the capacitance of the fifth capacitor C5 corresponding to the most significant bit of the digital output code DCODE corresponds to $2^4$ of the capacitance of the first capacitor C1. In other words, Ci satisfies $C1\times2^{i-1}$, where Ci indicates the capacitance of the i-th capacitor.

As such, the first digital-to-analog converter 140 and the second digital-to-analog converter 240 may have the same configuration including (M+N) drivers, and operate based on the same reference voltages VREFP and VREFN.

As shown in FIG. 19, each of the first digital-to-analog converter 140 in the first stage circuit STG1 and the second digital-to-analog converter 240 in the second stage circuit STG2 may have the same configuration capable of varying the voltage level of the comparison voltage VC within the full conversion range ECR of the analog input voltage VI. In other words, each of the first digital-to-analog converter 140 and the second digital-to-analog converter 240 may include (M+N) drivers corresponding to the (M+N) bits of the digital output code DCODE (e.g., M=2, N=3).

The first digital-to-analog converter 140 may vary the voltage level of the course comparison voltage CVC within the full conversion range ECR of the analog input voltage VI while performing the binary search conversion. The first digital-to-analog converter 140 may vary the voltage level of the course comparison voltage CVC within the full conversion range ECR by disabling the inverters INV1, INV2 INV3 in the drivers corresponding to the N lower bits, even if the configuration corresponds to the (M+N) bits. In FIG. 19, the disabled inverters INV1, INV2 and INV3 are shown hatched.

The second digital-to-analog converter 240 may vary the voltage level of the comparison voltage VC within the reduced conversion range RCR that is reduced by a factor of $2^M$ in comparison with the full conversion range ECR of the analog input voltage VI while performing the binary search conversion. The second digital-to-analog converter 240 may vary the voltage level of the comparison voltage VC within the reduced conversion range RCR by disabling the inverters INV4 and INV5 in the drivers corresponding to the M higher bits, even if the configuration corresponds to the (M+N) bits. In FIG. 19, the disabled inverters INV4 and INV5 are shown hatched.

In some implementations, as shown in FIG. 19, the first SAR logic circuit 130 may fix the logic levels of the first control signal CTR1, the second control signal CTR2 and the third control signal CTR3 corresponding to the three lower bits of the digital output code DCODE, to a logic high level H. On the other hand, the second SAR logic circuit 230 may fix the logic levels of the fourth control signal CTR4 and the fifth control signal CTR5, corresponding to the two higher bits of the digital output code DCODE, to a logic high level H. In this case, the first inverter INV1, second inverter INV2 and third inverter INV3 of the first digital-to-analog converter 140 and the fourth inverter INV4 and fifth inverter INV5 of the second digital-to-analog converter 240 may be disabled such that the pull-down units in the disabled inverters are always turned on.

The first SAR logic circuit 130 may vary the voltage level of the course comparison voltage CVC within the full conversion range ECR by varying each of the fourth control signal CTR4 and the fifth control signal CTR5 corresponding to the two higher bits of the digital output code DCODE to a logic low level L or a logic high level H. On the other hand, the second SAR logic circuit 230 may vary the voltage level of the comparison voltage VC within the reduced conversion range RCR by varying each of the first control signal CTR1, the second control signal CTR2 and the third control signal CTR3 corresponding to the three lower bits of the digital output code DCODE to a logic low level L or a logic high level H.

In this way, the first stage circuit STG1 may perform a binary search conversion by fixing the logic levels of the N first-stage control signals CTR1, CTR2 and CTR3 corresponding to the N lower bits among the first-stage control signals CTR1~CTR5 corresponding to the (M+N) bits of the digital output code DCODE and varying the logic levels of the M first-stage control signals CTR4 and CTR5 corresponding to the M higher bits. On the other hand, the second stage circuit STG2 may perform a binary search conversion by fixing the voltage levels of the M second-stage control signals CTR1 and CTR2 corresponding to the M higher bits and varying the logic levels of the N second-stage control signals CTR1, CTR2 and CTR3 corresponding to the N lower bits, among the second-stage control signals CTR1~CTR5 corresponding to the (M+N) bits of the digital output code DCODE.

FIG. 20 is similar to the configuration of FIG. 19, except that the first digital-to-analog converter 141 of the first stage circuit STRI includes two drivers corresponding to the two higher bits of the digital output code DCODE, and repeated description is omitted. In FIG. 20, the first capacitor C11 and the first inverter INV11 correspond to the first driver, and the second capacitor C12 and the second inverter INV12 correspond to the second driver. The first SAR logic circuit 131 may vary the voltage level of the course comparison voltage CVC within the full conversion range ECR by varying logic levels of the first control signal CTR11 and the second control signal CTR12 applied to the first inverter INV11 and the second inverter INV12 to a logic low level L or a logic high level H, respectively.

Figure 21:
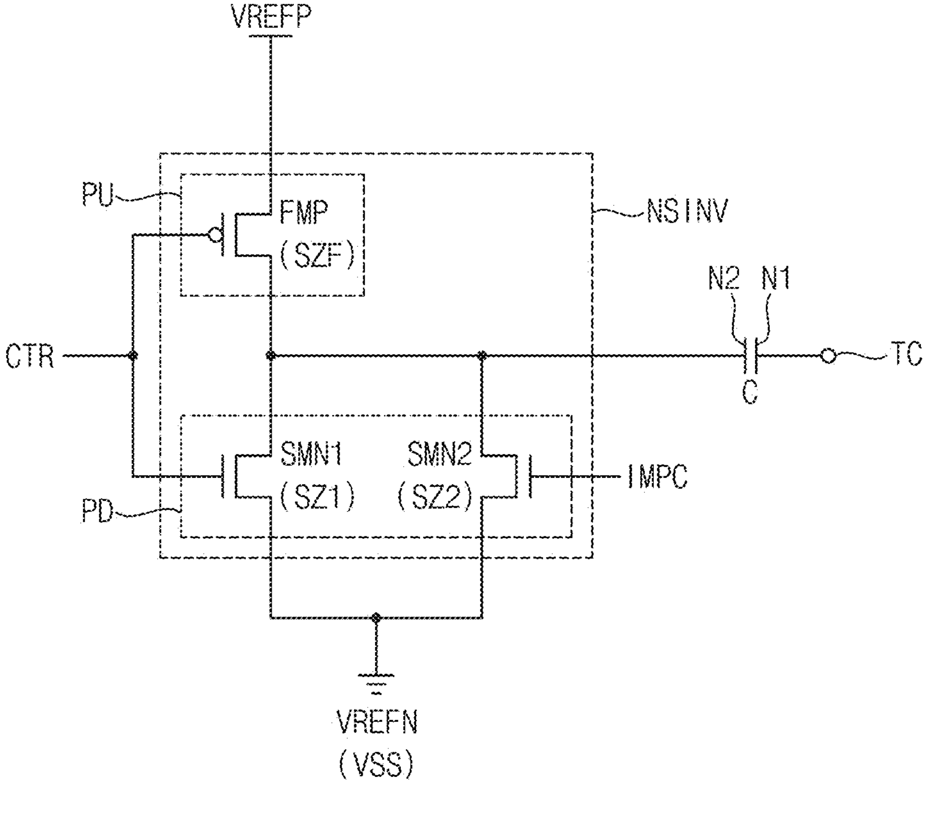
FIG. 21 is a circuit diagram illustrating an example of an N-type split inverter included in a digital-to-analog converter in FIG. 3 according to some implementations.
Figure 25:
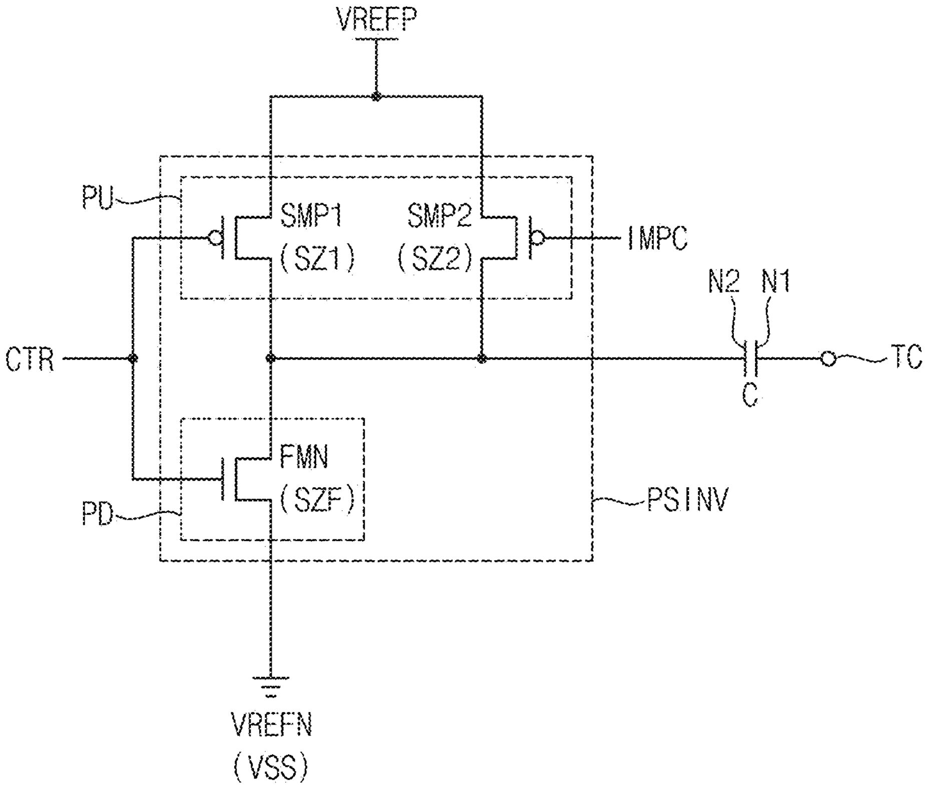
FIG. 25 is a circuit diagram illustrating an example of a P-type split inverter included in the digital-to-analog converter of FIG. 3 according to some implementations.

In some implementations, the normal inverter NINV of FIG. 4 included in each driver of the capacitor digital-to-analog converter may be replaced by at least one of an N-type split inverter of FIG. 21 and a P-type split inverter of FIG. 25.

Figure 22:
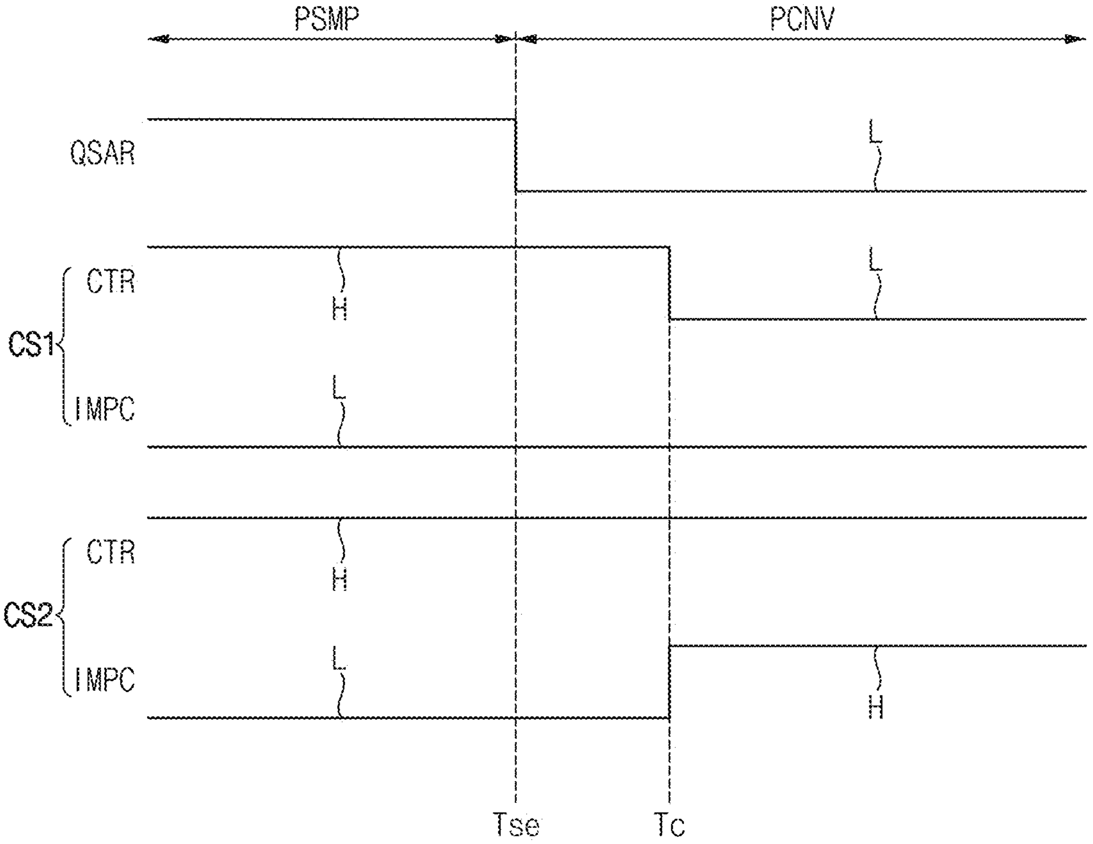
FIG. 22 is a timing diagram illustrating an example of an operation of the N-type split inverter of FIG. 21 according to some implementations.

FIG. 21 is a circuit diagram illustrating an example of an N-type split inverter included in a digital-to-analog converter in FIG. 3 according to some implementations, and FIG. 22 is a timing diagram illustrating an example of an operation of the N-type split inverter of FIG. 21 according to some implementations. Also, a capacitor C is shown in FIG. 21, wherein a second capacitor node N2 of the capacitor C corresponds to an output node of an N-type split inverter NSINV.

In FIG. 21, an N-type split inverter NSINV may include a pull-up unit PU and a pull-down unit PD. FIG. 21 illustrates an example of an N-type split inverter in which the pull-up unit PU includes one full PMOS transistor and the pull-down unit PD includes two split NMOS transistors.

The pull-up unit PU may include a full PMOS transistor FMP connected between a first reference voltage VREFP and a second capacitor node N2 corresponding to the output node of the N-type split inverter NSINV, and a corresponding control signal CTR among a plurality of control signals is applied to the gate electrode.

The pull-down unit PD may include a first split-NMOS transistor SMN1 and a second split-NMOS transistor SMN2. The first split-NMOS transistor SMN1 is connected between a second reference voltage VREFN and the second capacitor node N2 and the corresponding control signal CTR is applied to the gate electrode. The second split-NMOS transistor SMN2 is connected between the second reference voltage VREFN and the second capacitor node N2 and an impedance control signal IMPC is applied to the gate electrode.

The full PMOS transistor FMP in the pull-up unit PU of the N-type split inverter NSINV may be equal to the full PMOS transistor FMP in the pull-up unit PU of the normal inverter NINV of FIG. 5. The full NMOS transistor in the pull-down unit PD of the normal inverter NINV may be split into the first split NMOS transistor SMN1 and the second split NMOS transistor SMN2 in the pull-down unit PD of the N-type split inverter NSINV. The sum of the first size SZ1 of the first split NMOS transistor SMN1 and the second size SZ2 of the second split NMOS transistor SMN2 may be equal to the full size SZF of the full NMOS transistor FMN of the normal inverter NINV. The first size SZ1 of the first NMOS transistor SMN1 may be smaller than the full size SZF of the full PMOS transistor FMP.

The control signal CTR may be applied commonly to the gate electrodes of the full PMOS transistor FMP and the first split NMOS transistor SMN1. Accordingly, the full PMOS transistor FMP and the first split NMOS transistor SMN1 may be turned on complimentarily based on the control signal CTR. The second split NMOS transistor SMN2 may be turned on, independently of the first split NMOS transistor SMN1, based on the impedance control signal IMPC.

FIG. 22 illustrates an example of an operation when the N-type split inverter NSINV is applied to an analog-to-digital converter of SAR type according to some implementations. In FIG. 22, PSMP indicates a sampling period of the SAR-type analog-to-digital converter and PCNV indicates a conversion period of the SAR-type analog-to-digital converter. The sampling period PSMP and the conversion period PCNV for the binary search conversion are the same as described with reference to FIGS. 6 through 8. In FIG. 22, a first case CS1 corresponds to a case that the logic level of the control signal CTR is transitioned by the conversion operation, and a second case CS2 corresponds to a case that the logic level of the control signal CTR is maintained by the conversion operation.

In FIGS. 21 and 22, a SAR logic circuit may reset the control signal CTR to the logic high level H and reset the impedance control signal IMPC to the logic low level L such that the full PMOS transistor FMP and the second split NMOS transistor SMN2 may be turned off and the first split NMOS transistor SMN1 may be turned on before the binary search conversion, that is, during the sampling period PSMP.

In the conversion period PCNV, when the control signal CTR is transitioned by the conversion operation from the reset logic high level H to the logic low level L as the first case CS1, the impedance control signal IMPC may maintain the reset logic low level L. Accordingly, after the control signal CTR is transitioned, the full PMOS transistor FMP may be turned on, the first split NMOS transistor SMN1 may be turned off and the second split NMOS transistor SMN2 may maintain the turned-off state corresponding to the reset state.

The first size SZ1 of the first split NMOS transistor SMN1 may be smaller than the full size SZF of the full PMOS transistor FMP. The short current that may be generated when the control signal CTR transitions may be reduced as will be described below with reference to FIGS. 23 and 24, by reducing the first size SZ1 of the first split NMOS transistor SMN1.

In the conversion period PCNV, when the control signal CTR is maintained in the reset logic high level H by the conversion operation as the second case CS2, the impedance control signal IMPC may be transitioned from the reset logic low level L to the logic high level H. Accordingly, after the impedance control signal IMPC is transitioned, the full PMOS transistor FMP may maintain the turned-off state corresponding to the reset state, the first split NMOS transistor SMN1 may maintain the turned-on state corresponding to the reset state and the second split NMOS transistor SMN2 may be turned on.

The sum SZ1+SZ2 of the first size SZ1 of the first split NMOS transistor SMN1 and the second size SZ2 of the second split NMOS transistor SMN2 may be equal to the full size SZF of the full NMOS transistor FMN of the normal inverter NINV of FIG. 5. Accordingly, the composite turn-on resistance of the first split NMOS transistor SMN1 and the second split NMOS transistor SMN2 may be equal to the turn-on resistance of the full NMOS transistor FMN. As a result, in the second case CS2 when the first split NMOS transistor SMN1 maintain the turned-on state corresponding to the reset state, the second split NMOS transistor SMN2 may be turned on additionally and thus the impedance imposed to the control terminal TC may be controlled to be the same as a case of the normal inverter NINV.

Figure 23:
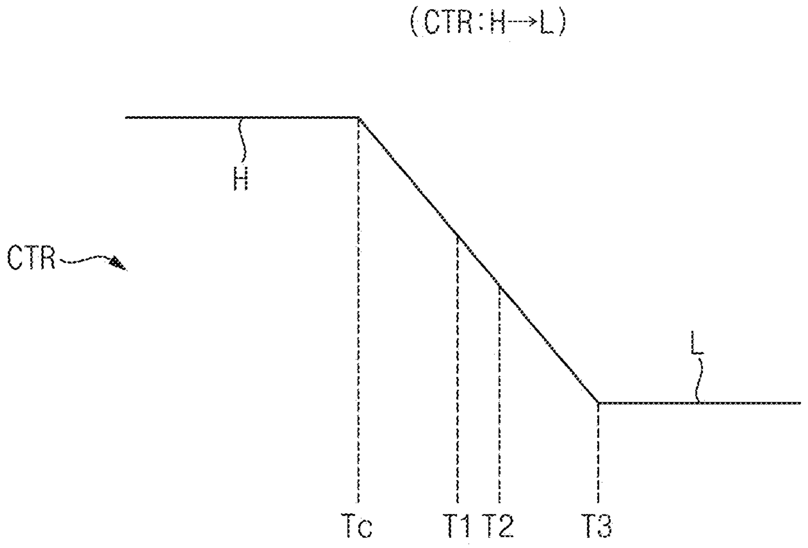
FIGS. 23 and 24 are diagrams illustrating an example of a short current reduction of the N-type split inverter of FIG. 21 according to some implementations.
Figure 24:
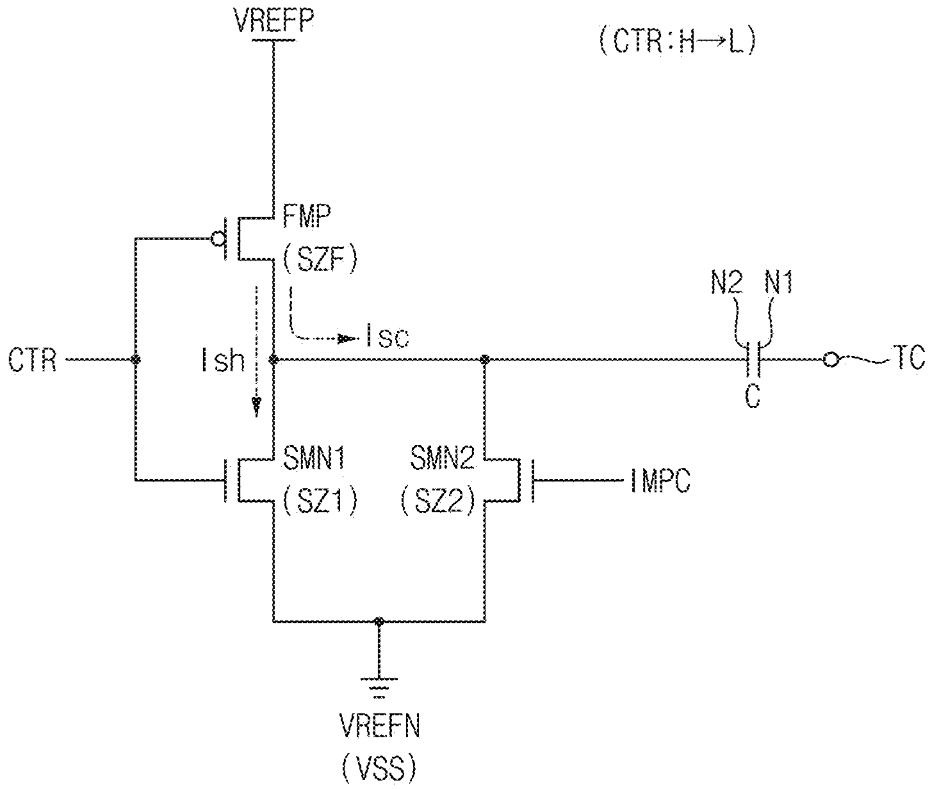

FIGS. 23 and 24 are diagrams illustrating an example of a short current reduction of the N-type split inverter of FIG. 21 according to some implementations. In FIGS. 23 and 24, the control signal CTR may transition from the logic high level H to the logic low level L during time interval Tc~T3, for example, with a constant slew rate. According to transitioning of the control signal CTR, the first split NMOS transistor SMN1 that is reset to the turned-on state may be turned off and the full PMOS transistor FMP that is reset to the turned-off state may be turned on. Through such switching operation, the sourcing current Isr may flow from the first reference voltage VREFP to the second capacitor node N2 and the voltage of the second capacitor node N2 may be pulled up from the second reference voltage VREFN to the first reference voltage VREFP. The second split NMOS transistor SMN2 may maintain the turned-off state corresponding to the reset state, as described with reference to FIGS. 21 and 22.

The full PMOS transistor FMP may start being turned on at time point T1 and the first split NMOS transistor SMN1 may be completely turned off at time point T2. In other words, both of the full PMOS transistor FMP and the first split NMOS transistor SMN1 may be turned on partially during time interval T1~T2, and thus a short current Ish flowing from the first reference voltage VREFP to the second reference voltage VREFN may be generated during time interval T1~T2.

As described above, the sum of the first size SZ1 of the first split NMOS transistor SMN1 and the second size SZ2 of the second split NMOS transistor SMN2 may be equal to the full size SZF of the full NMOS transistor FMN of the normal inverter NINV. For example, the division ratio of the first size SZ1 and the second size SZ2 may be 1:3, and in this case the first size SZ1 becomes ¼ of the full size SZF. As such, the turn-of resistance of the first split NMOS transistor SMN1 may be increased by reducing the first size of the first split NMOS transistor SMN1, and thus the short current Ish flowing through the first split NMOS transistor SMN1 may be reduced.

FIG. 25 is a circuit diagram illustrating an example of a P-type split inverter included in the digital-to-analog converter of FIG. 3 according to some implementations. Also, a capacitor C is illustrated in FIG. 25 and the second capacitor node N2 corresponds to an output node of a P-type split inverter PSINV.

In FIG. 25, the P-type split inverter PSINV may include a pull-up unit PU and a pull-down unit PD. The pull-up unit PU may include a first split PMOS transistor SMP1 and a second split PMOS transistor SMP2 and the pull-down unit PD may include a full NMOS transistor FMN.

The first split PMOS transistor SMP1 may be connected between the first reference voltage VREFP and the second capacitor node N2 corresponding to the output node and the control signal CTR may be applied to the gate electrode of the first split PMOS transistor SMP1.

The second split PMOS transistor SMP2 may be connected between the first reference voltage VREFP and the second capacitor node N2 and the impedance control signal IMPC may be applied to the gate electrode of the second split PMOS transistor SMP2.

The full NMOS transistor FMN may be connected between the second reference voltage VREFN and the second capacitor node N2 and the control signal CTR may be applied to the gate electrode of the full NMOS transistor FMN.

The full NMOS transistor FMN in the pull-down unit PD of the P-type split inverter PSINV may be equal to the full NMOS transistor FMN in the pull-down unit PD of the normal inverter NINV of FIG. 5. The full PMOS transistor in the pull-up unit PU of the normal inverter NINV may be split into the first split PMOS transistor SMP1 and the second split PMOS transistor SMP2 in the pull-up unit PU of the P-type split inverter PSINV. The sum of the first size SZ1 of the first split PMOS transistor SMP1 and the second size SZ2 of the second split PMOS transistor SMP2 may be equal to the full size SZF of the full PMOS transistor FMP of the normal inverter NINV. The first size SZ1 of the first PMOS transistor SMP1 may be smaller than the full size SZF of the full NMOS transistor FMN.

The control signal CTR may be applied commonly to the gate electrodes of the full NMOS transistor FMN and the first split PMOS transistor SMP1. Accordingly, the full NMOS transistor FMN and the first split PMOS transistor SMP1 may be turned on complimentarily based on the control signal CTR. The second split PMOS transistor SMP2 may be turned on, independently of the first split PMOS transistor SMP1, based on the impedance control signal IMPC.

The operation of the P-type split inverter PSINV is similar to the operation of the N-type split inverter NSINV, as described with reference to FIGS. 22 through 24, and repeated description is omitted. As such, the N-type split inverter NSINV and/or the P-type split inverter PSINV according to some implementations may reduce the short current Ish, and the capacitor digital-to-analog converter may utilize the N-type split inverter NSINV and/or the P-type split inverter PSINV to reduce the power consumption. The operation speed of the pipelined analog-to-digital converters and semiconductor devices including the pipelined analog-to-digital converters may be improved by reducing the short currents without the addition of logic delays and without affecting the switching timing of the pipelined analog-to-digital converter.

Figure 26:
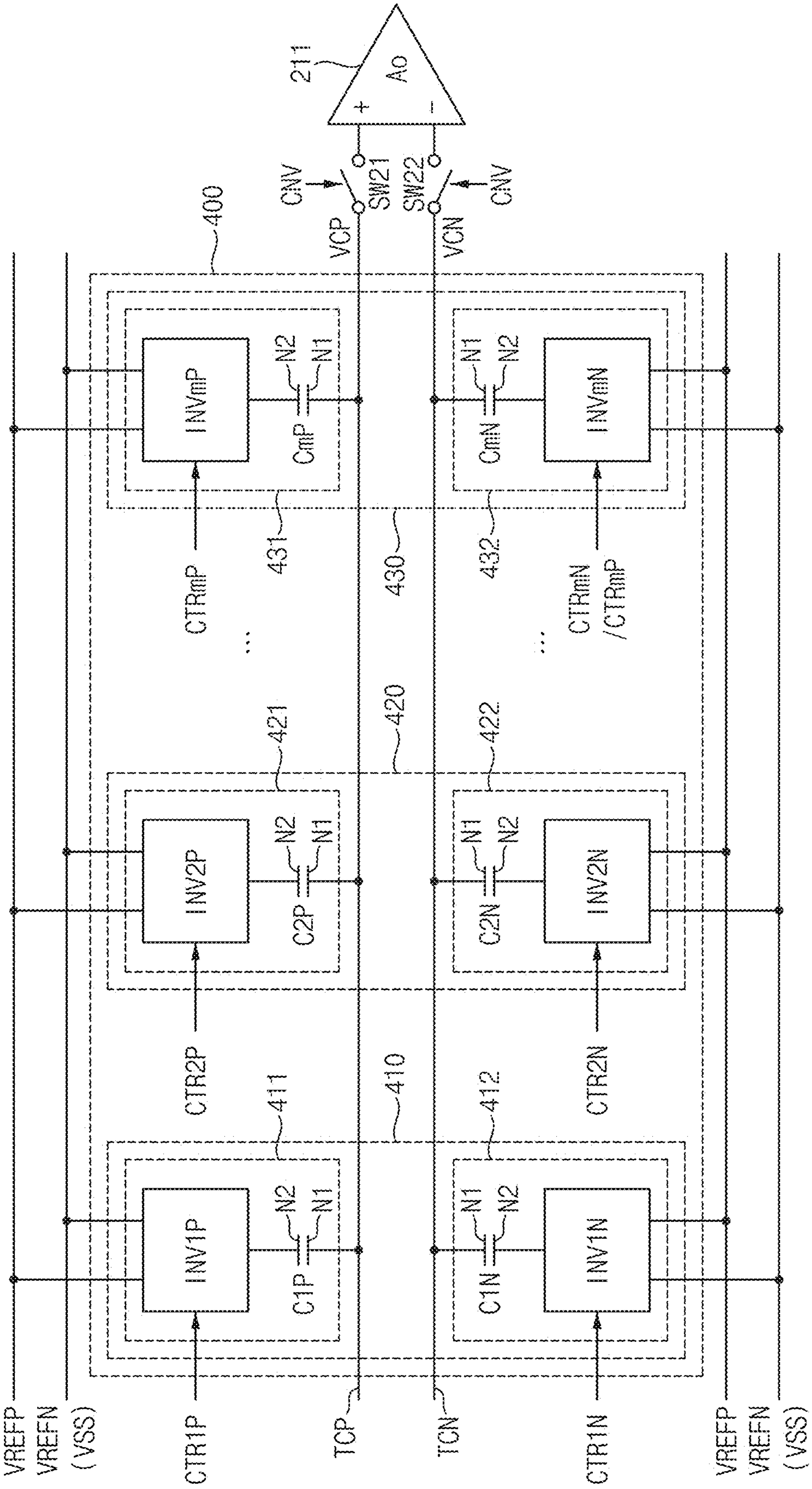
FIG. 26 is a diagram illustrating an example of a digital-to-analog converter included in the second stage circuit of FIG. 3 according to some implementations.

While analog-to-digital conversion for single-ended signals has been described with reference to FIG. 4 and the like, some implementations may also be applied to analog-to-digital conversion for differential signals. In FIG. 26, a digital-to-analog converter for analog-to-digital conversion of differential signals is described.

FIG. 26 is a diagram illustrating an example of a digital-to-analog converter included in the second stage circuit of FIG. 3 according to some implementations. Also, a residue amplifier 211, as described above, is shown in FIG. 26.

In FIG. 26, a capacitor digital-to-analog converter 404 of a differential configuration may include a plurality of drivers 411, 412, 421, 422, 431 and 432. The plurality of drivers 411, 412, 421, 422, 431 and 432 may each include a plurality of inverters INV1P, INV1N, INV2P, INV2N, INVmP and INVmN, and capacitors C1P, C1N, C2P, C2N, CmP and CmN.

The plurality of drivers 411, 412, 421, 422, 431 and 432 may be divided into a plurality of driver pairs 410, 420 and 430, each corresponding to a plurality of bits of the digital signal DCODE as described above. Each driver pair of the plurality of driver pairs 410, 420 and 430 may include positive drivers 411, 421 and 431 connected to a positive control terminal TCP that generates a positive comparison voltage VCP and negative drivers 412, 422 and 432 connected to a negative control terminal TCP that generates a negative comparison voltage VCN. The positive control terminal TCP may be connected to the positive input terminal (+) of the residue amplifier 210 via a switch SW21 and the negative control terminal TCN may be connected to the negative input terminal (−) of the residue amplifier 211 via a switch SW22. The switches SW21 and SW22 may be turned on in response to the conversion signal CNV to apply a differential comparison voltage pair VCP and VCN to the differential input terminal pair (+, −) of the residue amplifier 211.

The positive drivers 411, 421 and 431 may include positive inverters INV1P, INV2P and INVmP, respectively, and the negative drivers 412, 422 and 432 may include negative inverters INV1N, IN2N and INVmN, respectively.

The inverter INV1P of the first positive driver 411 included in the first driver pair 410 may perform a switching operation on the first positive control signal CTR1P and drive the second node N2 of the first positive capacitor C1P. The inverter INV1N of the first negative driver 412 included in the first driver pair 410 may perform a switching operation based on the first negative control signal CTR1N and drive the second node N2 of the first negative capacitor C1N. The first positive control signal CTR1P and the first negative control signal CTR1N correspond to the first control signal CTR1, which corresponds to the least significant bit, i.e., the first bit, of the digital output signal DCODE.

The inverter INV2P of the second positive driver 421 included in the second driver pair 420 may perform a switching operation based on the second positive control signal CTR2P and drive the second node N2 of the second positive capacitor C2P. The inverter INV2N of the second negative driver 422 included in the second driver pair 420 may perform a switching operation based on the second negative control signal CTR2N and drive the second node N2 of the second negative capacitor C2N. The second positive control signal CTR2P and the second negative control signal CTR2N correspond to the second control signal CTR2 corresponding to the second bit of the digital output signal DCODE.

The inverter INVmP of the m-positive driver 431 included in the m-th driver pair 130 may perform a switching operation based on the m-th positive control signal CTRmP and drive the second node N2 of the m-th positive capacitor CmP. The inverter INVmN of the m-th negative driver 432 included in the m-th driver pair 430 may perform a switching operation based on the m-th negative control signal CTRmN and drive the second node N2 of the m-th negative capacitor CmN. The m-th positive control signal CTRmP and the m-th negative control signal CTRmN correspond to the m-th control signal CTRm corresponding to the most significant bit, i.e., the m-th bit, of the digital output signal DCODE.

To enable the binary search conversion of FIGS. 6 through 8 to be performed, the capacitance of the second positive capacitor C2P and the second negative capacitor C2N corresponding to the second bit of the digital output signal DCODE may be 21 times the capacitance of the first positive capacitor C1P and the first negative capacitor C1N corresponding to the first bit of the digital output signal DCODE. In this way, the capacitance of the m-th positive capacitor CmP and the m-th negative capacitor CmN corresponding to the m-th bit of the digital output signal DCODE may be $2^{m}-1$ times the capacitance of the first positive capacitor C1P and the first negative capacitor C1N corresponding to the first bit of the digital output signal DCODE.

While the above description focuses on the pipelined analog-to-digital converters including two stage circuits, example embodiments may also be applied to pipelined analog-to-digital converters including three or more stage circuits.

Figure 27:
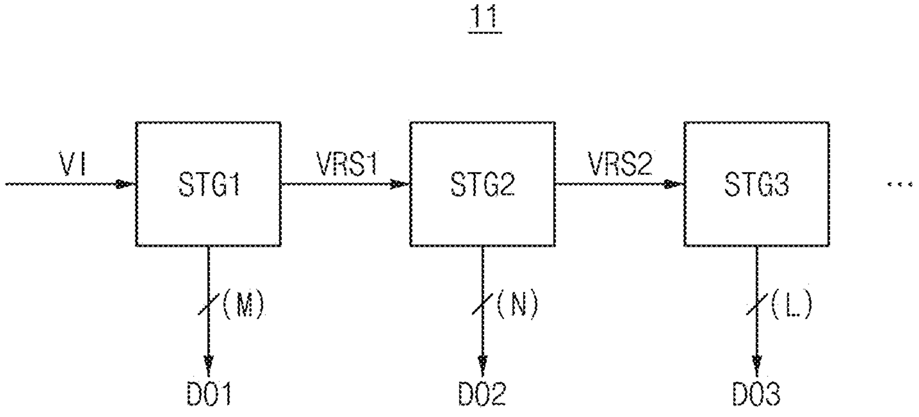
FIG. 27 is a diagram illustrating an example of a pipelined analog-to-digital converter according to some implementations.

FIG. 27 is a diagram illustrating an example of a pipelined analog-to-digital converter according to some implementations. In FIG. 27, a pipeline analog-to-digital converter 11 may include a plurality of stage circuits, such as a first stage circuit STG1, a second stage circuit STG2, and a third stage circuit STG3.

The first stage circuit STG1 may perform an analog-to-digital conversion on the analog input voltage VI to generate a first output signal DO1 including M higher bits among (M+N+L) bits of a digital output code DCODE corresponding to the analog input voltage VI, where M, N, and L are each natural numbers. The first stage circuit 100 may perform various analog-to-digital conversions, such as flash type, sigma-delta type, SAR type, and the like. Further, the first stage circuit STG1 may generate a first residue voltage VRS1 corresponding to (N+L) middle and lower bits among the (M+N+L) bits of the digital output code DCODE.

The second stage circuit STG2 may generate a first amplified residue voltage and a first amplified comparison voltage by sequentially amplifying the first residue voltage VRS1 and a first comparison voltage using one residue amplifier as described above, and may perform a SAR-type analog-to-digital conversion of the first amplified residue voltage based on the first amplified comparison voltage to generate a second output signal DO2 including N middle bits among the (M+N+L) bits of the digital output code DCODE. Further, the second stage circuit STG2 may generate a second residue voltage VRS2 corresponding to L lower bits among the (M+N+L) bits of the digital output code DCODE.

The third stage circuit STG3 may generate a second amplified residue voltage and a second amplified comparison voltage by sequentially amplifying the second residue voltage VRS2 and the second comparison voltage using another residue amplifier as described above, and performing a SAR-type analog-to-digital conversion on the second amplified residue voltage based on the second amplified comparison voltage to generate a third output signal DO3 including the L lower bits corresponding to the second residue voltage.

Figure 28:
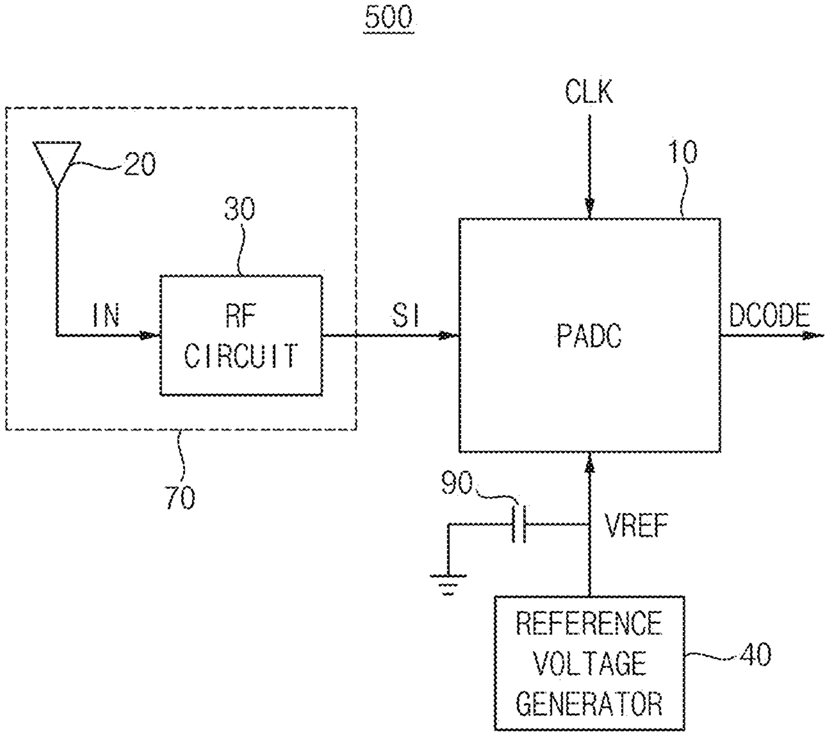
FIG. 28 a block diagram illustrating an example of a device including a pipelined analog-to-digital converter of SAR type according to some implementations.

FIG. 28 a block diagram illustrating an example of a communication device according to some implementations. In FIG. 38, the communication device includes a pipelined analog-to-digital converter of SAR type according to some implementations. The present disclosure is not limited to a communication device and may be applied any device and system including an analog-to-digital converter.

In FIG. 28, the communication device may include a pipelined analog-to-digital converter (PADC) 10, a reference voltage generator 40 and/or an analog circuit 70. The analog circuit 70 may include an antenna 20 and a radio frequency (RF) circuit 30. In some example embodiments, the communication device may denote a reception terminal that receives various pieces of information. However, the present disclosure is not limited thereto. In some implementations, the communication device may denote a transmission terminal that transmits various pieces of information, or a transceiver that performs both a reception function and a transmission function. Respective components included in the communication device may be implemented using hardware blocks, such as analog circuits and/or digital circuits, or software blocks such as instructions executed by a processor, etc.

The RF circuit 30 may receive an RF signal IN through the antenna 20 and may generate a baseband signal by performing down-conversion on the received RF signal IN. The baseband signal may be referred to as an analog input signal SI. In some implementations, the RF circuit 30 may generate the analog input signal SI by performing direct conversion so that the RF signal IN is directly converted into a baseband signal. In some implementations, the RF circuit 30 may convert the RF signal IN into an Intermediated Frequency (IF) signal and may generate the analog input signal SI by performing 2-step down conversion so that the IF signal is converted into the baseband signal.

The pipelined analog-to-digital converter 10 may receive the analog input signal SI and may convert the received analog input signal SI into a digital output signal or a digital code DCODE. According to some implementations, the pipeline analog-to-digital converter 10 may include a second stage circuit that performs a SAR-type analog-to-digital conversion by sequentially amplifying a residual voltage and a comparison voltage using one residual amplifier, as described above.

The reference voltage generator 40 may generate a reference voltage VREF and may provide the generated reference voltage VREF to the ADC 10. The reference voltage VREF may include the first reference voltage VREFP and the second reference voltage VREFN as described above.

The reference voltage generator 40 requires high power consumption because it must supply the peak current depending on the high frequency signal for the rapid switching operation of the capacitor digital-to-analog converter (CDAC) included in the pipeline analog-to-digital converter 10, and may consume more power than the core circuitry of the pipeline analog-to-digital converter 10 itself. When a low-power reference voltage generator is used to reduce the band width, a large output capacitor 90 is required to reduce the voltage change caused by the peak current of the pipeline analog-to-digital converter 10 operating at a high rate. For example, to secure a 12-bit resolution, an output capacitor of 1 nF or more is required, which accounts for the highest percentage (e.g., about 50%) of the total area of the SAR-type pipeline analog-to-digital converter 10 and the reference voltage generator 40. In addition, as the number of SAR-type pipeline analog-to-digital converters included in the semiconductor chip increases, the area occupied by the output capacitor 90 increases.

The pipeline analog-to-digital converter 10 according to example embodiments may reduce the size of the output capacitor 90 of the reference voltage generator 40 by sequentially amplifying the residual voltage and the comparison voltage using one residual amplifier to reduce power consumption, and thus reduce the implementation area of the semiconductor device 500 including the pipeline analog-to-digital converter 10.

Figure 29:
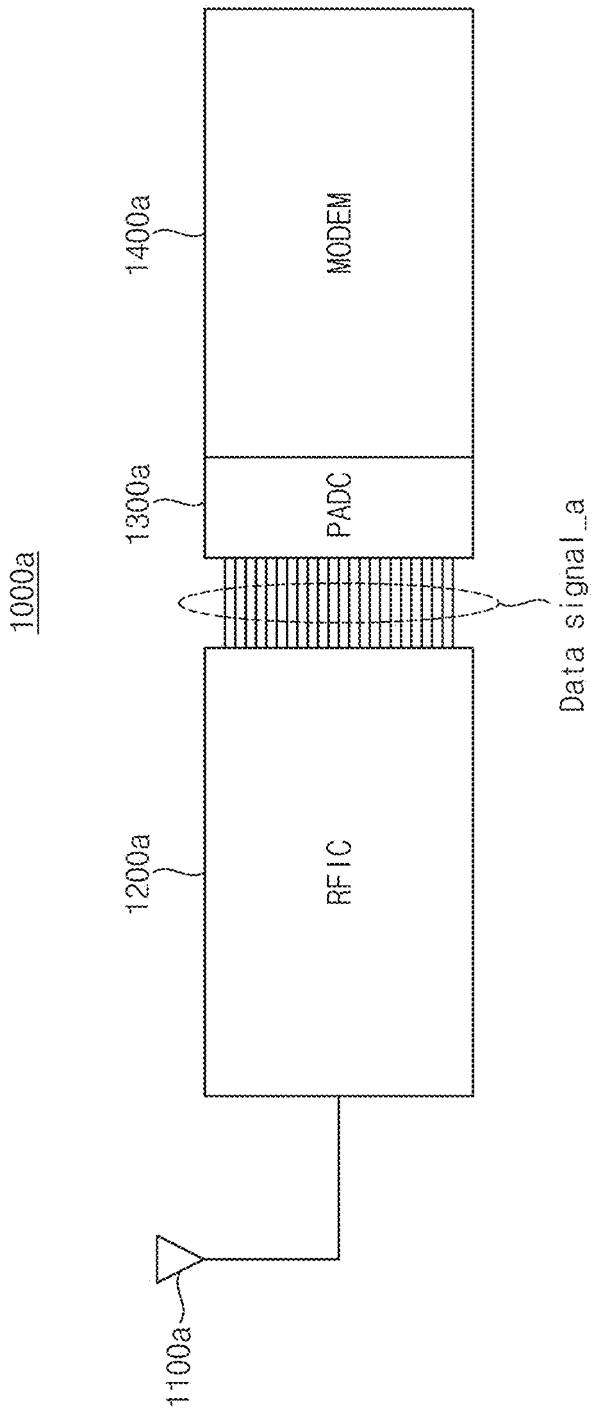
FIGS. 29 and 30 are block diagrams illustrating an example of a communication device according to some implementations.
Figure 30:
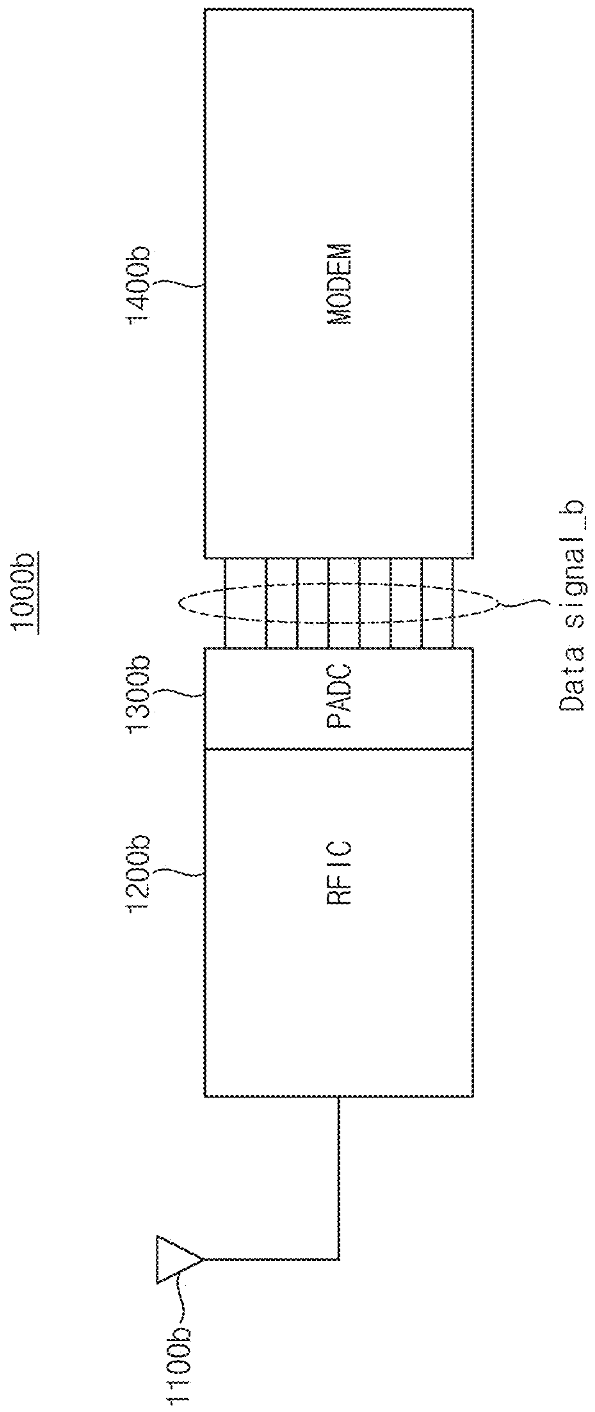

FIGS. 29 and 30 are block diagrams illustrating an example of a communication device according to some implementations. In FIG. 29, a communication device **1000*a* may include an antenna 1100*a*, a radio frequency integrated circuit (RFIC) 1200*a*, a pipelined analog-to-digital converter (PADC) 1300*a*, and/or a modem 1400*a*. The RFIC 1200*a* may receive a wireless signal via the antenna 1100*a* and may decrease a frequency of the wireless signal to a baseband, thereby providing an analog data signal DATA signal a to the ADC 1300*a*. The ADC 1300*a* may convert the analog data signal DATA signal a into a digital data signal, and the modem 1400*a*** may convert the digital data signal into a data signal that may be processed by an application processor (AP).

In some implementations, the pipelined analog-to-digital converter **1300*a* and the modem 1400*a* may be embodied as a single chip. The single chip including the pipeline analog-to-digital converter 1300*a* and the modem 1400*a* may be coupled to the RFIC 1200*a* via a plurality of analog signal lines. The pipelined analog-to-digital converter 1300*a*** may include at least one SAR-type analog-to-digital converter implemented using a single residue amplifier according to example embodiments to reduce power consumption. Thus, example embodiments may be usefully applied to modem chips.

In FIG. 30, unlike the example of FIG. 29, an RFIC **1200*b* and a pipelined analog-to-digital converter 1300*b* of a communication device 1000*b* may be embodied as a single chip. The single chip including the RFIC 1200*b* and the pipelined analog-to-digital converter 1300*b* may transmit a digital input signal DATA signal b to a modem 1400*b*. The modem 1400*b* may convert the digital input signal DATA signal b into a data signal that may be processed by the AP. The single chip including the RFIC 1200*b* and the pipelined analog-to-digital converter 1300*b* may be connected to the modem 1400*b* via multiple digital signal lines. The pipelined analog-to-digital converter 1300*b*** may include at least one SAR-type analog-to-digital converter including implemented using a single residue amplifier according to example embodiments to reduce power consumption. Accordingly, some implementations may be usefully applied to modem chips.

Figure 31:
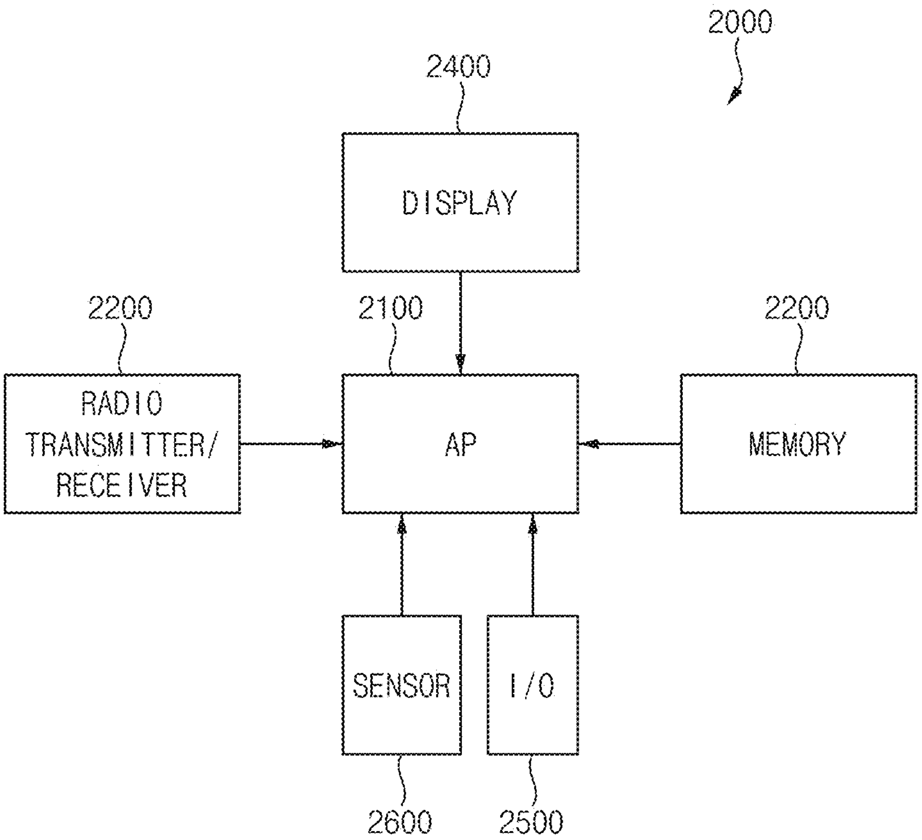
FIG. 31 is a block diagram illustrating an example of an internet of things (IoT) device according to some implementations.

FIG. 31 is a block diagram illustrating an example of an internet of things (IoT) device according to some implementations. In FIG. 31, an ADC, as described above, may be included in an Internet of Things (IoT) device 2000. IoT may denote a system of internetworking products using wired/wireless communication. An IoT device may have an accessible wired or wireless interface and may exchange data with at least one device via the wired or wireless interface. The accessible wired or wireless interface may include a Local Area Network (LAN), a Wireless Local Area Network (WLAN) such as Wi-Fi, a Wireless Personal Area Network (WPAN) such as Bluetooth, a Wireless Universal Serial Bus (USB), Zigbee, Near Field Communication (NFC), Radio-frequency Identification (RFID), Power Line Communication (PLC), a modem communication interface, e.g., third generation (3G), fourth generation (4G), or Long Term Evolution (LTE), which may access a mobile cellular network. The Bluetooth interface may support Bluetooth Low Energy (BLE).

In particular, the IoT device 2000 may include a communication interface 2200 to communicate with an external device. The communication interface 2200 may be, for example, a wireless short-range communication interface such as a LAN, Bluetooth, Wi-Fi, or Zigbee, or a modem communication interface, e.g., PLC, 3G, or LTE, which may access a mobile communication network. The communication interface 2200 may include a transmitter, a receiver or a transceiver (transmitter and receiver). The IoT device 2000 may transmit information to and/or receive information from an access point or a gateway through the communication interface. Also, the IoT device 2000 may transmit and/or receive control information or data of the IoT device 2000 by communicating with a user device or another IoT device.

The receiver of the communication interface 2200 may include a pipelined analog-to-digital converter according to some implementations, and the pipeline analog-to-digital converter may be implemented as described above with reference to FIGS. 1 through 27. Specifically, the receiver included in the communication interface 2200 may include a pipeline analog-to-digital converter, and the pipeline analog-to-digital converter has a configuration capable of reducing power consumption as described above.

The IoT device 2000 may include a processor, such as an AP 2100, for executing an arithmetic operation. The IoT device 2000 may further include a power supply, such as a battery or an external power supply which receives power from an outside source. Also, the IoT device 2000 may include a display 2400 for displaying data, such as an internal state of the IoT device 2000. The user may control the IoT device 2000 via a user interface (UI) of the display 2400. The IoT device 2000 may transmit the internal state and/or data through the transmitter and may receive a control instruction and/or data from the outside through the receiver.

A memory 2300 may store a control instruction code for controlling the IoT device 2000, control data, or user data. The memory 2300 may include at least one of a volatile memory and a non-volatile memory. The IoT device 2000 may further include a storage device. The storage device may be a non-volatile medium. The storage device may store user information provided via an input/output device 2500 and sensing information collected through a sensor 2600.

As described above, the pipelined analog-to-digital converter and the method of analog-to-digital conversion according to some implementations may reduce power consumption for analog-to-digital conversion and enhance accuracy of the analog-to-digital conversion, by sequentially amplifying the residue voltage and the comparison voltage using the one residue amplifier.

Some implementations may be applied to any electronic devices and systems including an analog-to-digital converter. For example, some implementations may be applied to systems, such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a communication device, an automotive driving device, etc.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

What is claimed is:

1. A pipelined analog-to-digital converter comprising:

a first stage circuit configured to perform an analog-to-digital conversion on an analog input voltage, generate a first output signal including M higher bits among (M+N) bits of a digital output code corresponding to the analog input voltage, and generate a residue voltage corresponding to N lower bits among the (M+N) bits of the digital output code, wherein M and N are natural numbers; and a second stage circuit including a residue amplifier configured to sequentially amplify the residue voltage and a comparison voltage to generate an amplified residue voltage and an amplified comparison voltage, respectively, wherein the second stage circuit is further configured to perform an analog-to-digital conversion on the amplified residue voltage based on the amplified comparison voltage to generate a second output signal including the N lower bits corresponding to the residue voltage, and wherein the second stage circuit further includes:

a first input switch configured to turn on in response to a sampling signal activated in a sampling period so as to apply the residue voltage to an input terminal of the residue amplifier; and a second input switch configured to turn on in response to a conversion signal activated in a conversion period following the sampling period so as to apply the comparison voltage to the input terminal of the residue amplifier.

2. The pipelined analog-to-digital converter of claim 1, wherein the residue amplifier is configured to amplify the residue voltage in a sampling period to generate the amplified residue voltage, and to amplify the comparison voltage in a conversion period following the sampling period to generate the amplified comparison voltage.

3. The pipelined analog-to-digital converter of claim 1, wherein the second stage circuit is configured to perform the analog-to-digital conversion of successive approximation register (SAR) type by performing a binary search conversion that sequentially determines the N lower bits from a most significant bit to a least significant bit with varying a voltage level of the comparison voltage, wherein the second stage circuit is configured to vary the voltage level of the comparison voltage within a reduced conversion range while performing the binary search conversion, and wherein the reduce conversion range is reduced by a factor of $2^M$ in comparison with a full conversion range of the analog input voltage.

4. The pipelined analog-to-digital converter of claim 1, wherein the residue amplifier comprises an amplifier having an open loop structure.

5. The pipelined analog-to-digital converter of claim 1, wherein the residue amplifier is configured to amplify the residue voltage and the comparison voltage with a fixed gain without gain calibration.

6. The pipelined analog-to-digital converter of claim 1, wherein the second stage circuit further includes:

a comparison circuit configured to compare the amplified residue voltage and the amplified comparison voltage to generate a comparison result signal;

a SAR logic circuit configured to generate a plurality of control signals for a binary search conversion based on the comparison result signal; and a digital-to-analog converter configured to generate the comparison voltage based on the plurality of control signals.

7. The pipelined analog-to-digital converter of claim 6, wherein the digital-to-analog converter is configured to vary a voltage level of the comparison voltage within a full conversion range of the analog input voltage, wherein the digital-to-analog converter is configured to vary the voltage level of the comparison voltage within a reduced conversion range while performing the binary search conversion, and wherein the reduce conversion range is reduced by a factor of $2^M$ in comparison with the full conversion range of the analog input voltage.

8. The pipelined analog-to-digital converter of claim 6, wherein the SAR logic circuit is configured to vary a voltage of the comparison voltage while performing the binary search conversion, by fixing logic levels of M control signals corresponding to the M higher bits among (M+N) control signals corresponding to the (M+N) bits of the digital output code and by varying logic levels of N control signals corresponding to the N lower bits among the (M+N) control signals, and to provide the (M+N) control signals to the digital-to-analog converter.

9. The pipelined analog-to-digital converter of claim 6, wherein the SAR logic circuit is configured to generate N control signals corresponding to the N lower bits excluding M control signals corresponding to the M higher bits, and to provide the N control signals to the digital-to-analog converter.

10. The pipelined analog-to-digital converter of claim 6, wherein the digital-to-analog converter includes:

(M+N) drivers corresponding to the (M+N) bits of the digital output code, the (M+N) drivers being configured to control a voltage level of the comparison voltage based on a positive reference voltage, a negative reference voltage, and the plurality of control signals, and wherein each driver of the (M+N) drivers includes:

a capacitor comprising a first capacitor node and a second capacitor node, the first capacitor node being connected to a control terminal generating the comparison voltage; and an inverter including a pull-up unit connected to the positive reference voltage and a pull-down unit connected to the negative reference voltage, the inverter being configured to drive the second capacitor node by turning on, based on each control signal of the plurality of control signals, one of the pull-up unit and the pull-down unit.

11. The pipelined analog-to-digital converter of claim 10, wherein a voltage corresponding to a logic high level is applied to inverters included in M drivers corresponding to the M higher bits among the (M+N) drivers such that pull-down units included in the M drivers are turned on while performing the binary search conversion.

12. The pipelined analog-to-digital converter of claim 1, wherein the first stage circuit includes:

an analog-to-digital converter configured to perform the analog-to-digital conversion on the analog input voltage to generate the M higher bits;

a digital-to-analog converter configured to perform a digital-to-analog conversion on the M higher bits to generate a coarse comparison voltage corresponding to the M higher bits; and a voltage subtractor configured to generate the residue voltage by subtracting the coarse comparison voltage from the analog input voltage.

13. The pipelined analog-to-digital converter of claim 12, wherein a voltage level of the coarse comparison voltage of the first stage circuit varies within a full conversion range of the analog input voltage, and wherein a voltage level of the comparison voltage of the second stage circuit varies within a reduced conversion range that is reduced by a factor of $2^M$ in comparison with the full conversion range.

14. The pipelined analog-to-digital converter of claim 1, wherein the first stage circuit includes a first digital-to-analog converter configured to generate a coarse comparison voltage based on first-stage control signals and the first stage circuit is further configured to perform the analog-to-digital conversion of a successive approximation register (SAR) type by performing a binary search conversion that sequentially determines the M higher bits from a most significant bit to a least significant bit with varying a voltage level of the coarse comparison voltage, wherein the second stage circuit includes a second digital-to-analog converter configured to generate the comparison voltage based on second-stage control signals, and wherein the second stage circuit is further configured to perform the analog-to-digital conversion of SAR type by performing a binary search conversion that sequentially determines the N lower bits from a most significant bit to a least significant bit with varying a voltage level of the comparison voltage.

15. The pipelined analog-to-digital converter of claim 14, wherein the voltage level of the coarse comparison voltage of the first stage circuit varies within a full conversion range of the analog input voltage, and wherein the voltage level of the comparison voltage of the second stage circuit varies within a reduced conversion range that is reduced by a factor of $2^M$ in comparison with the full conversion range.

16. The pipelined analog-to-digital converter of claim 14, wherein the first digital-to-analog converter and the second digital-to-analog converter have a same configuration, and wherein the first digital-to-analog converter and the second digital-to-analog converter operate based on a same reference voltage.

17. The pipelined analog-to-digital converter of claim 14, wherein the first stage circuit is configured to perform a binary search conversion by fixing logic levels of N first-stage control signals corresponding to the N lower bits among (M+N) first-stage control signals corresponding to the (M+N) bits of the digital output code and varying logic levels of M first-stage control signals corresponding to the M higher bits among the (M+N) first-stage control signals, and wherein the second stage circuit is configured to perform a binary search conversion by fixing logic levels of M second stage control signals corresponding to the M higher bits among (M+N) second-stage control signals corresponding to the (M+N) bits of the digital output code and varying logic levels of N second-stage control signals corresponding to the N lower bits among the (M+N) second-stage control signals.

18. A pipelined analog-to-digital converter comprising:

a first analog-to-digital converter configured to perform an analog-to-digital conversion on an analog input signal to generate a first output signal including M higher bits among (M+N) bits of a digital output code corresponding to the analog input signal, wherein M and N are natural numbers;

a first digital-to-analog converter configured to perform a digital-to-analog conversion on the M higher bits to generate a coarse comparison voltage corresponding to the M higher bits;

a voltage subtractor configured to generate a residue voltage corresponding to N lower bits among the (M+N) bits of the digital output code by subtracting the coarse comparison voltage from the analog input signal;

a residue amplifier configured to sequentially amplifying the residue voltage and a comparison voltage so as to generate an amplified residue voltage and an amplified comparison voltage;

a first input switch configured to turn on in response to a sampling signal activated in a sampling period so as to apply the residue voltage to an input terminal of the residue amplifier;

a second input switch configured to turn on in response to a conversion signal activated in a conversion period following the sampling period so as to apply the comparison voltage to the input terminal of the residue amplifier;

a comparison circuit configured to compare the amplified residue voltage and the amplified comparison voltage so as to generate a comparison result signal;

a successive approximation register (SAR) logic circuit configured to generate a plurality of control signals for a binary search conversion based on the comparison result signal and to generate a second output signal including the N lower bits corresponding to the residue voltage; and a second digital-to-analog converter configured to generate the comparison voltage based on the plurality of control signals.

19. A method of analog-to-digital conversion, comprising:

performing an analog-to-digital conversion on an analog input voltage to generate a first output signal including M higher bits among (M+N) bits of a digital output code corresponding to the analog input voltage wherein M and N are natural numbers;

generating a residue voltage corresponding to N lower bits among the (M+N) bits of the digital output code;

sequentially amplifying the residue voltage and a comparison voltage using a single residue amplifier to generate an amplified residue voltage and an amplified comparison voltage; and performing an analog-to-digital conversion on the amplified residue voltage based on the amplified comparison voltage to generate a second output signal including the N lower bits corresponding to the residue voltage, wherein the residue voltage and the comparison voltage are amplified with a fixed gain without gain calibration.

* * * * *